(12) United States Patent
Bhattacharyya

(10) Patent No.: US 7,250,628 B2
(45) Date of Patent: Jul. 31, 2007

(54) MEMORY DEVICES AND ELECTRONIC SYSTEMS COMPRISING THYRISTORS

(75) Inventor: Arup Bhattacharyya, Essex Junction, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/182,983

(22) Filed: Jul. 15, 2005

(65) Prior Publication Data

US 2005/0263763 A1 Dec. 1, 2005

Related U.S. Application Data

(63) Continuation of application No. 10/954,079, filed on Sep. 28, 2004, now Pat. No. 6,958,263, which is a continuation of application No. 10/364,213, filed on Feb. 10, 2003, now Pat. No. 6,812,504.

(51) Int. Cl.
*H01L 29/10* (2006.01)
*H01L 29/76* (2006.01)
*H01L 31/036* (2006.01)
*H01L 31/112* (2006.01)
*H01L 29/49* (2006.01)

(52) U.S. Cl. .............. 257/66; 257/67; 257/19; 257/144; 257/152; 257/E29.035

(58) Field of Classification Search .............. None
See application file for complete search history.

(56) References Cited

U.S. PATENT DOCUMENTS 6,229,161 B1 * 5/2001 Nemati et al. .............. 257/133
6,274,888 B1 * 8/2001 Suzuki et al. .............. 257/72
6,690,038 B1 * 2/2004 Cho et al. .................. 257/133
6,713,810 B1   3/2004 Bhattacharyya
6,727,529 B2   4/2004 Nemati et al.
2001/0048119 A1 * 12/2001 Mizuno et al. ............. 257/192
2002/0024152 A1 *  2/2002 Momoi et al. ............. 257/913
2002/0190265 A1 * 12/2002 Hsu et al. .................. 257/107

(Continued)

OTHER PUBLICATIONS

Ono, K. et al., "Analysis of Current-Voltage Characteristics in Polysilicon TFTs for LCDs", IEDM Tech. Digest, 1988, pp. 256-259.

(Continued)

*Primary Examiner*—Evan Pert
*Assistant Examiner*—Benjamin P. Sandvik
(74) *Attorney, Agent, or Firm*—Wells St. John P.S.

(57) ABSTRACT

The invention includes SOI constructions containing one or more memory cells which include a transistor and a thyristor. In one aspect, a scalable GLTRAM cell provides DRAM-like density and SRAM-like performance. The memory cell includes an access transistor and a gated-lateral thyristor integrally formed above the access transistor. The cathode region (n+) of the stacked lateral thyristor device (p+/n/p/n+) is physically and electrically connected to one of the source/drain regions of the FET to act as the storage node for the memory cell. The FET transistor can include an active region which extends into a Si/Ge material. The material comprising Si/Ge can have a relaxed crystalline lattice, and a layer having a strained crystalline lattice can be between the material having the relaxed crystalline lattice and the transistor gate. The device construction can be formed over a versatile substrate base.

18 Claims, 12 Drawing Sheets

U.S. PATENT DOCUMENTS

2003/0006461 A1* 1/2003 Tezuka et al. .............. 257/347
2003/0164501 A1 9/2003 Suzuki et al.

OTHER PUBLICATIONS

Yamauchi, N. et al., "Drastically Improved Performance in Poly-Si TFTs with Channel Dimensions Comparable to Grain Size", IEDM Tech. Digest, 1989, pp. 353-356.

King, T. et al, "A Low-Temperature ($\leqq$550° C) Silicon-Germanium MOS Thin-Film Transistor Technology for Large-Area Electronics", IEDM Tech. Digest, 1991, pp. 567-570.

Kuriyama, H. et al., "High Mobility Poly-Si TFT by a New Excimer Laser Annealing Method for Large Area Electronics", IEDM Tech. Digest, 1991, pp. 563-566.

Jeon, J. et al., "A New Poly-Si TFT with Selectively Doped Channel Fabricated by Novel Excimer Laser Annealing", IEDM Tech. Digest, 2000, pp. 213-216.

Kim, C.H. et al., "A New High-Performance Poly-Si TFT by Simple Excimer Laser Annealing on Selectively Floating a-Si Layer", IEDM Tech. Digest, 2001, pp. 751-754.

Hara, A. et al, "Selective Single-Crystalline-Silicon Growth at the Pre-Defined Active Regions of TFTs on a Glass by a Scanning CW Layer Irradiation", IEDM Tech. Digest, 2000, pp. 209-212.

Hara, A. et al., "High Performance Poly-Si TFTs on a Glass by a Stable Scanning CW Laser Lateral Crystallization", IEDM Tech. Digest, 2001, pp. 747-750.

Jagar, S. et al., "Single Grain Thin-Fim-Transistor (TFT) with SOI CMOS Performance Formed by Metal-Induced-Lateral-Crystallization", IEDM Tech. Digest, 1999, p. 293-296.

Gu, J. et al., "High Performance Sub-100 nm Si Thin-Film Transistors by Pattern-Controlled Crystallization of Thin Channel Layer and High Temperature Annealing", DRC Conf. Digest 2002, pp. 49-50.

Kesan, V. et al., "High Performance 0.25 µm p-MOSFETs with Silicon-Germanium Channels for 300K and 77K Operation", IEDM Tech. Digest, 1991, pp. 25-28.

Garone, P.M. et al., "Mobility Enhancement and Quantum Mechanical Modeling in $Ge_xSi_{1-x}$ Channel MOSFETs from 90 to 300K", IEDM Tech. Digest, 1991, pp. 29-32.

Feder, B.J., "I.B.M. Finds Way to Speed Up Chips", The New York Times, Jun. 8, 2001, reprinted from http://www.nytimes.com/2001/06/08 /technology/08BLUE.html, 2 pgs.

Rim, K. et al., "Strained Si NMOSFET's for High Performance CMOS Technology", 2001 Sympos. on VLSI Tech. Digest of Technical Papers, p. 59-60.

Li, P. et al., "Design of High Speed Si/SiGe Heterojunction Complementary MOSFETs with Reduced Short-Channel Effects", Natl. Central University, ChungLi, Taiwan, ROC, Aug. 2001, Contract No. NSC 89-2215-E-008-049, Natl. Science Council of Taiwan., pp. 1, 9.

Ernst, T. et al., "Fabrication of a Novel Strained SiGe:C-channel Planar 55 nm nMOSFET for High-Performance CMOS", 2002 Sympos. on VLSI Tech. Digest of Technical Papers, pp. 92-93.

Rim, K. et al., "Characteristics and Device Design of Sub-100 nm Strained SiN- and PMOSFETs", 2002 Sympos. on VLSI Tech. Digest of Technical Papers, pp. 98-99.

Belford, R.E. et al., "Performance-Augmented CMOS Using Back-End Uniaxial Strain", DRC Conf. Digest, 2002, pp. 41-42.

Shima, M. et al., "<100> Channel Strained-SiGe p-MOSFET with Enhanced Hole Mobility and Lower Parasitic Resistance", 2002 Sympos. on_VLSI Tech. Digest of Technical Papers, pp. 94-95.

Nayfeh, H.M. et al., "Electron Inversion Layer Mobility in Strained-Si n-MOSFET's with High Channel Doping Concentration Achieved by Ion Implantation", DRC Conf. Digest, 2002, pp. 43-44.

Bae, G.J. et al., "A Novel SiGe-Inserted SOI Structure for High Performance PDSOI CMOSFET", IEDM Tech. Digest, 2000, pp. 667-670.

Cheng, Z. et al., "SiGe-on-Insulator (SGOI): Substrate Preparation and MOSFET Fabrication for Electron Mobility Evaluation" and conference outline, MIT Microsystems, Tech. Labs, Cambridge, MA, 2001 IEEE Internatl. SOI Conf., Oct. 2001, pp. 13-14, 3-pg. outline.

Huang, L.J. et al., "Carrier Mobility Enhancement in Strained Si-on-Insulator Fabricated by Wafer Bonding", 2001 Sympos. on VLSI Tech. Digest of Technical Papers, pp. 57-58.

Mizuno, T. et al., "High Performance CMOS Operation of Strained-SOI MOSFETs Using Thin Film SiGe-on-Insulator Substrate", 2002 Sympos. on VLSI Tech. Digest of Technical Papers, p. 106-107.

Tezuka, T. et al., "High-Performance Strained Si-on-Insulator MOSFETs by Novel Fabrication Processes Utilizing Ge-Condensation Technique", 2002 VLSI Tech. Digest of Technical Papers, pp. 96-97.

Takagi, S., "Strained-Si- and SiGe-on-Insulator (Strained SOI and SGOI) MOSFETs for High Performance/Low Power CMOS Application", DRC Conf. Digest, 2002, pp. 37-40.

"IBM Builds World's Fastest Communications Microchip", Reuters U.S. Company News, Feb. 25, 2002, reprinted from http://activequote300.fidelity.com/rtrnews/_individual_n . . . / . . . , 1 pg.

Markoff, J., "I.B.M. Circuits are Now Faster and Reduce Use of Power", The New York Times, Feb. 25, 2002, reprinted Mar. 20, 2002, from http://story.news.yahoo.com/ news?tmpl=story&u=/nyt/20020225/ . . . , 1 pg.

Park, J.S. et al., "Normal Incident SiGe/Si Multiple Quantum Well Infrared Detector", IEDM Tech. Digest, 1991, pp. 749-752.

Current, M.I. et al., "Atomic-Layer Cleaving with $Si_xGe_y$ Strain Layers for Fabrication of Si and Ge-Rich SOI Device Layers", 2001 IEEE Internatl. SOI Conf. Oct. 2001, pp. 11-12.

Bhattacharyya, A., "The Role of Microelectronic Integration in Environmental Control: A Perspective", Mat. Res. Soc. Symp. Proc. vol. 344, 1994, pp. 281-293.

Myers, S.M. et al., "Deuterium Interactions in Oxygen-Implanted Copper", J. Appl. Phys., vol. 65(1),. Jan. 1, 1989, p. 311-321.

Saggio, M. et al., "Innovative Localized Lifetime Control in High-Speed IGBT's", IEEE Elec. Dev. Lett., V. 18, No. 7, Jul. 1997, pp. 333-335.

Lu, N.C.C. et al., "A Buried-Trench DRAM Cell Using a Self-Aligned Epitaxy Over Trench Technology", IEDM Tech. Digest, 1988, pp. 588-591.

Yamada, T. et al., "Spread Source/Drain (SSD) MOSFET Using Selective Silicon Growth for 64Mbit DRAMs", IEDM Tech. Digest, 1989, pp. 35-38.

van Meer, H. et al., "Ultra-Thin Film Fully-Depleted SOI CMOS with Raised G/S/D Device Architecture for Sub-100 nm Applications", 2001 IEEE Internatl. SOI Conf. Oct. 2001, pp. 45-46.

Nemati, F. et al., "A Novel Thyristor-Based SRAM Cell (T-RAM) for High-Speed, Low-Voltage, Giga-Scale Memories", IEEE 1999, IEDM, pp. 11.5.1-11.5.4.

* cited by examiner

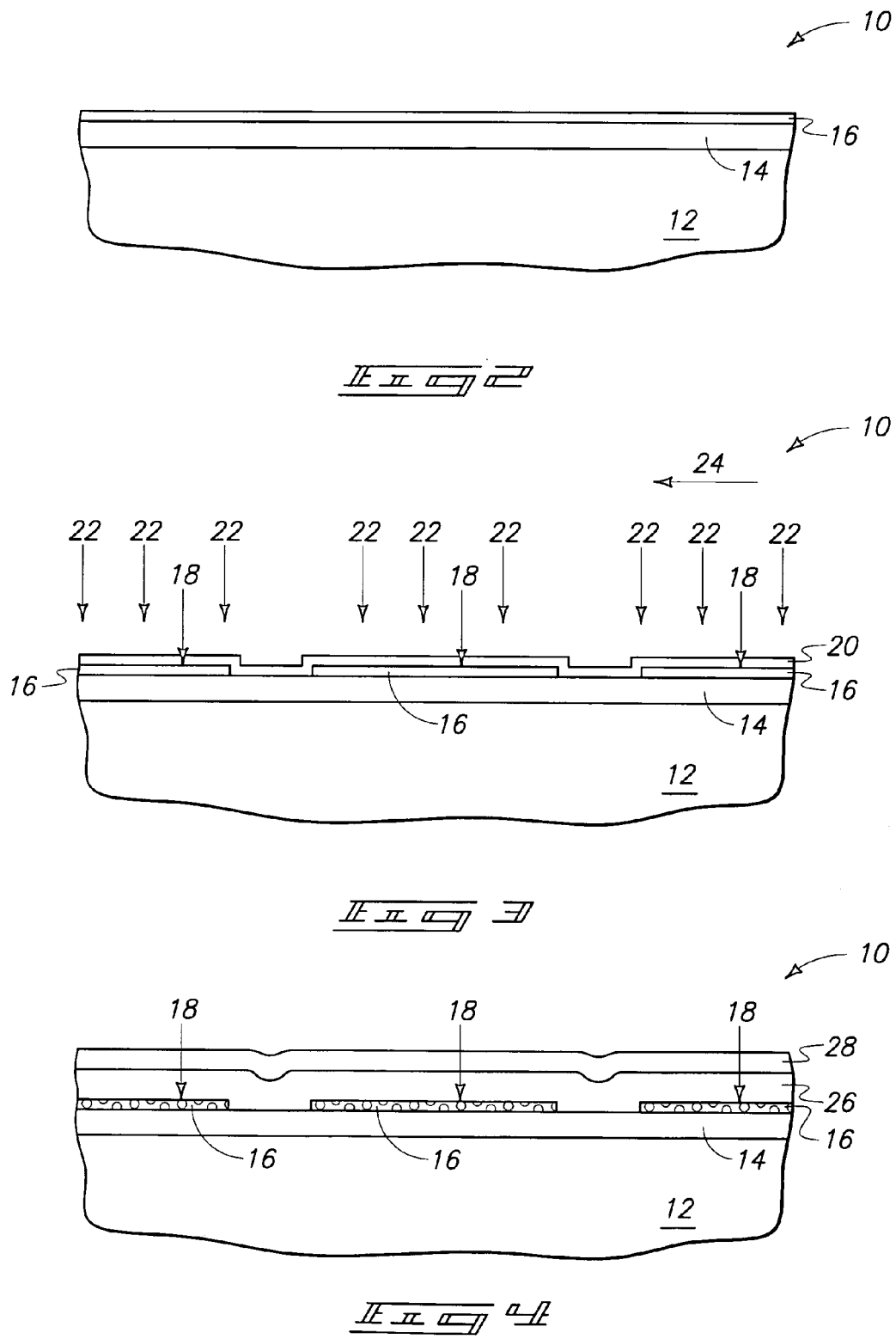

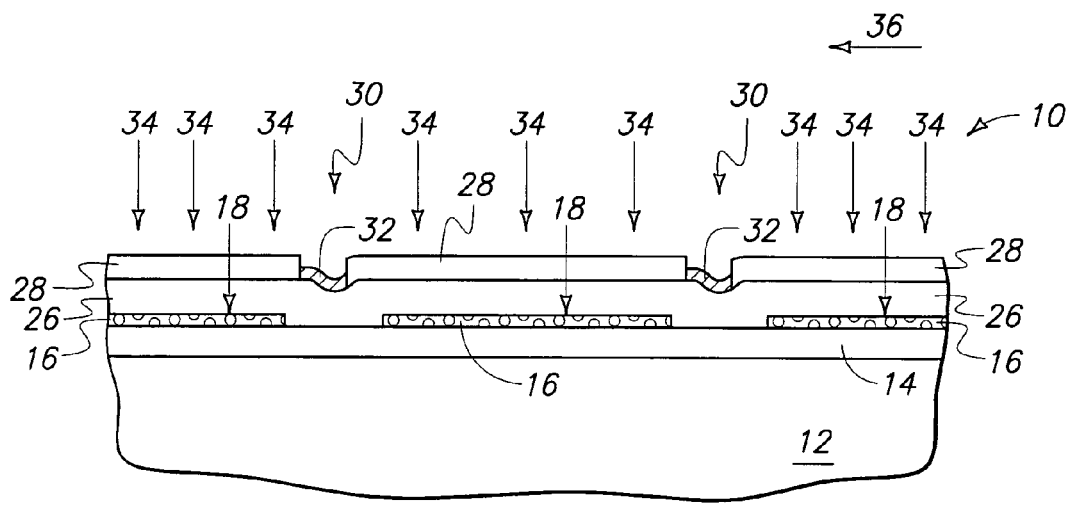
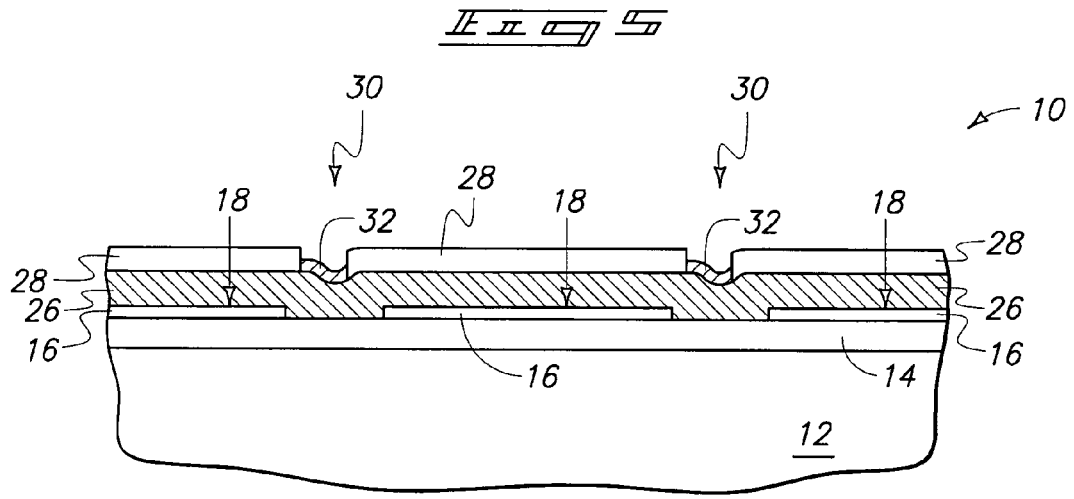
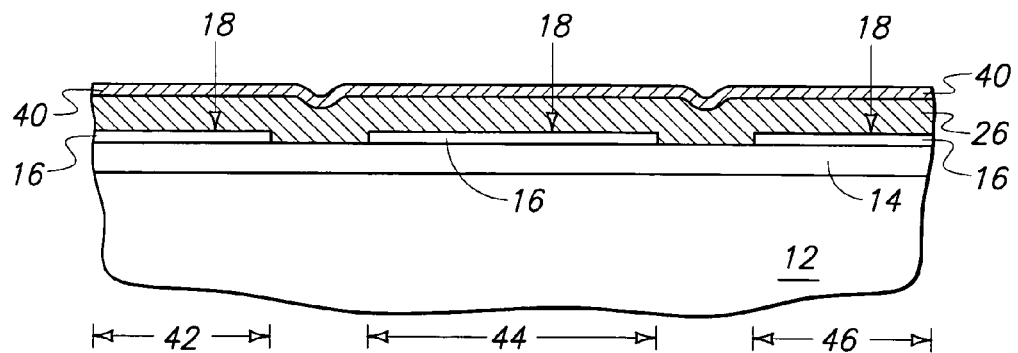

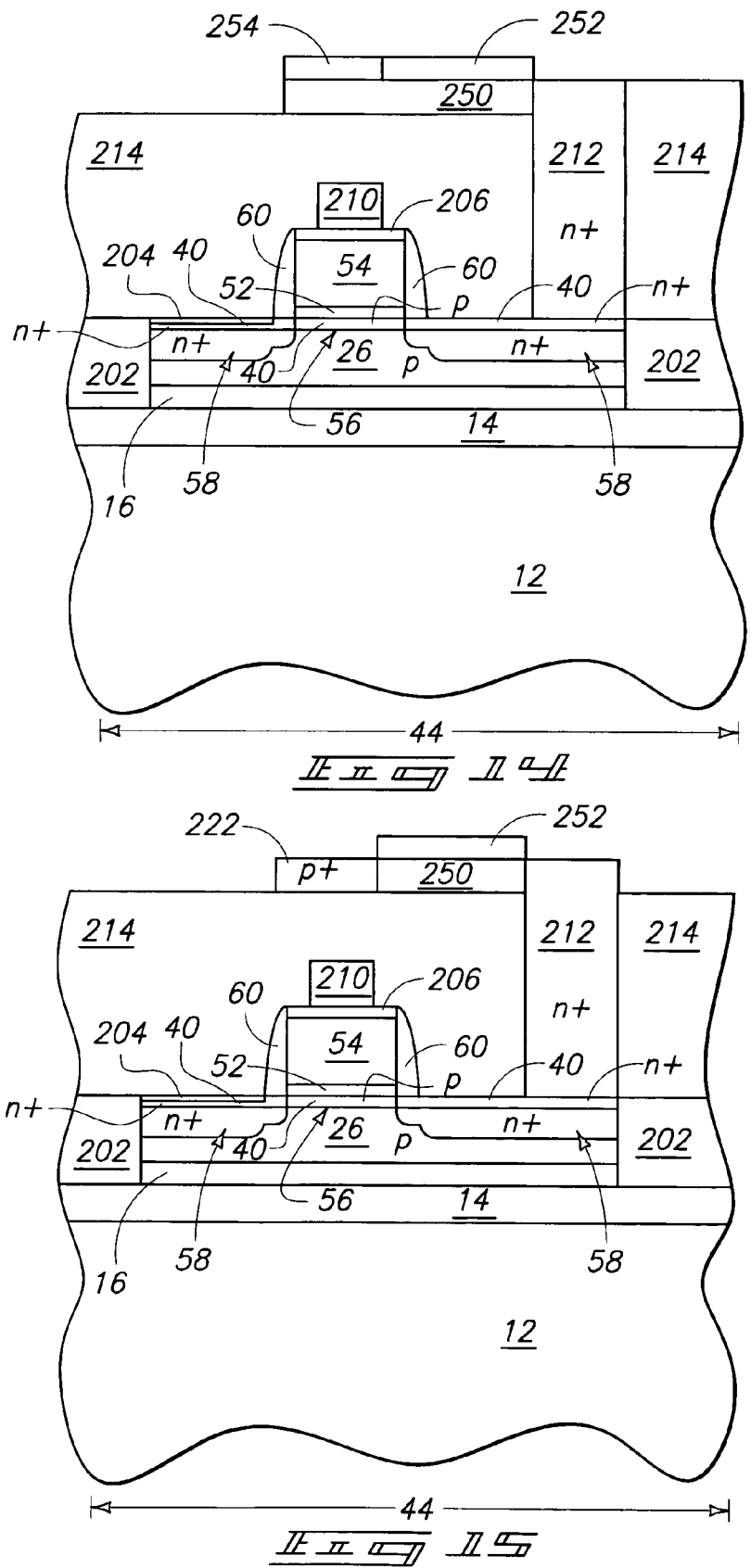

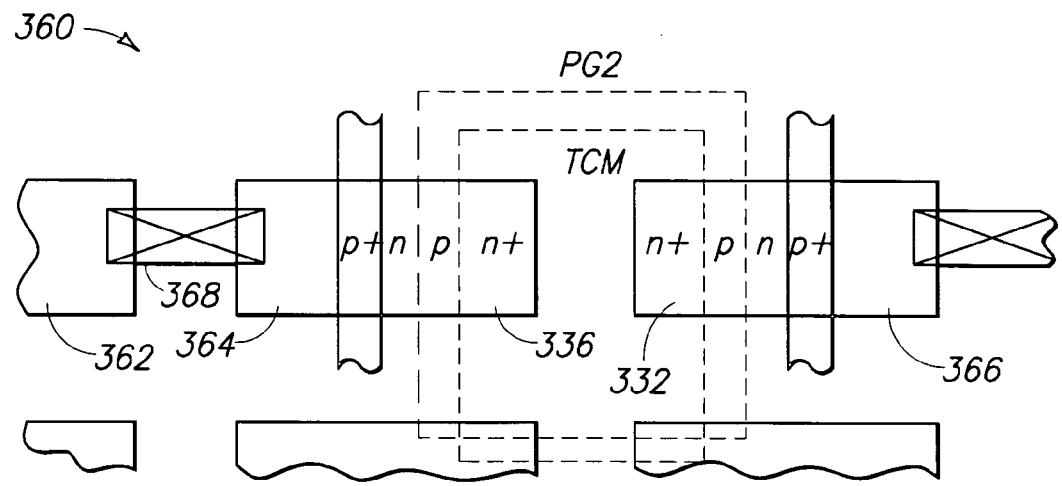
_FIG. 17_
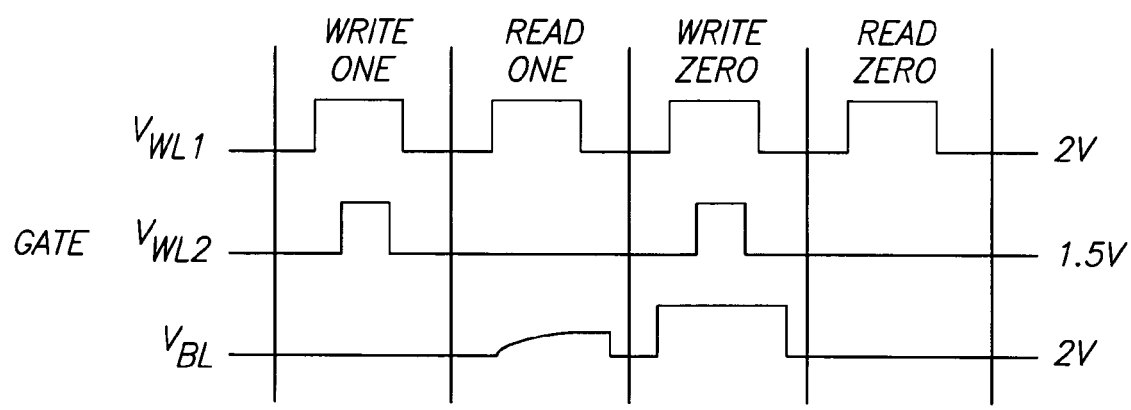
_FIG. 18_

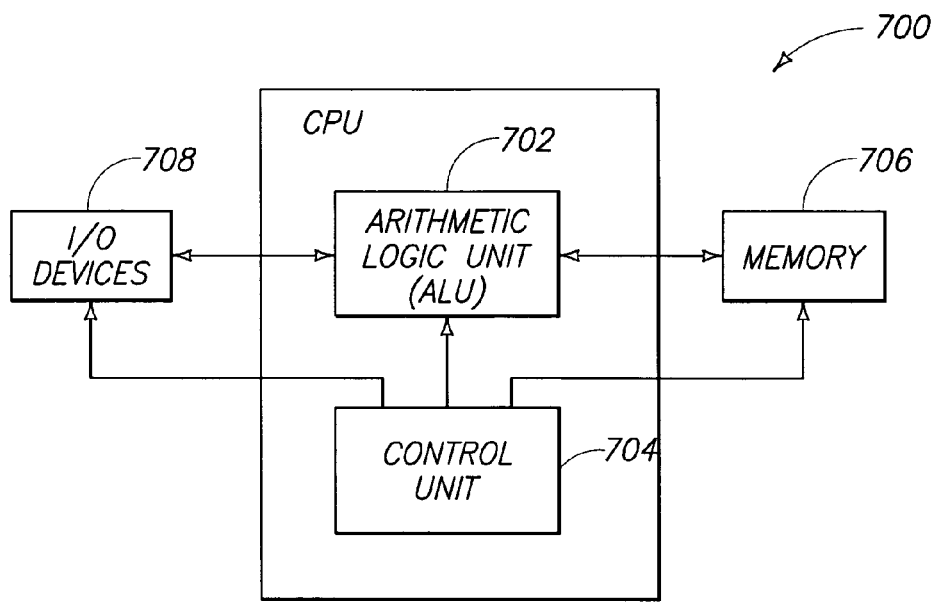
_Fig. 21_
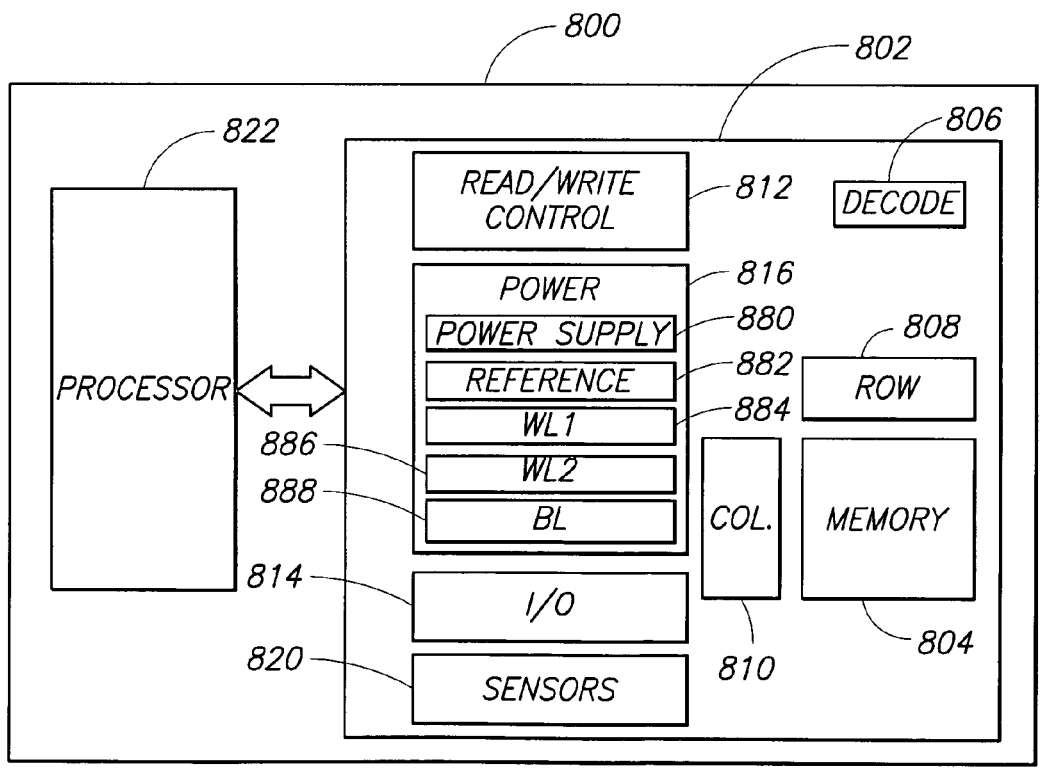
_Fig. 22_

MEMORY DEVICES AND ELECTRONIC SYSTEMS COMPRISING THYRISTORS

RELATED PATENT DATA

This patent resulted from a continuation application of U.S. patent application Ser. No. 10/954,079, filed Sep. 28, 2004 now U.S. Pat. No. 6,958,263, and which is hereby incorporated by reference; which is a continuation application of U.S. patent application Ser. No. 10/364,213, filed Feb. 10, 2003, issued as U.S. Pat. No. 6,812,504, and which is hereby incorporated by reference.

TECHNICAL FIELD

This disclosure relates generally to integrated circuits, and more particularly, to memory cells containing thyristors. Exemplary memory cells comprise gated lateral thyristor-containing random access memory (GLTRAM) cells incorporated into TFT constructions. Such constructions can be formed over a versatile substrate base.

BACKGROUND OF THE INVENTION

SOI technology differs from traditional bulk semiconductor technologies in that the active semiconductor material of SOI technologies is typically much thinner than that utilized in bulk technologies. The active semiconductor material of SOI technologies will typically be formed as a thin film over an insulating material (typically oxide), with exemplary thicknesses of the semiconductor film being less than or equal to 2000 Å. In contrast, bulk semiconductor material will typically have a thickness of at least about 200 microns. The thin semiconductor of SOI technology can allow higher performance and lower power consumption to be achieved in integrated circuits than can be achieved with similar circuits utilizing bulk materials.

An exemplary integrated circuit device that can be formed utilizing SOI technologies is a so-called thin film transistor (TFT), with the term "thin film" referring to the thin semiconductor film of the SOI construction. In particular aspects, the semiconductor material of the SOI construction can be silicon, and in such aspects the TFTs can be fabricated using recrystallized amorphous silicon or polycrystalline silicon. The silicon can be supported by an electrically insulative material (such as silicon dioxide), which in turn is supported by an appropriate substrate. Exemplary substrate materials include glass, bulk silicon and metal-oxides (such as, for example, $Al_2O_3$). If the semiconductor material comprises silicon, the term SOI is occasionally utilized to refer to a silicon-on-insulator construction, rather than the more general concept of a semiconductor-on-insulator construction. However, it is to be understood that in the context of this disclosure the term SOI refers to semiconductor-on-insulator constructions. Accordingly, the semiconductor material of an SOI construction referred to in the context of this disclosure can comprise other semiconductive materials in addition to, or alternatively to, silicon; including, for example, germanium.

A problem associated with conventional TFT constructions is that grain boundaries and defects can limit carrier mobilities. Accordingly, carrier mobilities are frequently nearly an order of magnitude lower than they would be in bulk semiconductor devices. High voltage (and therefore high power consumption), and large areas are utilized for the TFTs, and the TFTs exhibit limited performance. TFTs thus have limited commercial application and currently are utilized primarily for large area electronics.

Various efforts have been made to improve carrier mobility of TFTs. Some improvement is obtained for devices in which silicon is the semiconductor material by utilizing a thermal anneal for grain growth following silicon ion implantation and hydrogen passivation of grain boundaries (see, for example, Yamauchi, N. et al., "Drastically Improved Performance in Poly-Si TFTs with Channel Dimensions Comparable to Grain Size", IEDM Tech. Digest, 1989, pp. 353-356). Improvements have also been made in devices in which a combination of silicon and germanium is the semiconductor material by optimizing the germanium and hydrogen content of silicon/germanium films (see, for example, King, T. J. et al, "A Low-Temperature (<=550° C.) Silicon-Germanium MOS TFT Technology for Large-Area Electronics", IEDM Tech. Digest, 1991, pp. 567-570).

Investigations have shown that nucleation, direction of solidification, and grain growth of silicon crystals can be controlled selectively and preferentially by excimer laser annealing, as well as by lateral scanning continuous wave laser irradiation/anneal for recrystallization (see, for example, Kuriyama, H. et al., "High Mobility Poly-Si TFT by a New Excimer Laser Annealing Method for Large Area Electronics", IEDM Tech. Digest, 1991, pp. 563-566; Jeon, J. H. et al., "A New Poly-Si TFT with Selectively Doped Channel Fabricated by Novel Excimer Laser Annealing", IEDM Tech. Digest, 2000, pp. 213-216; Kim, C. H. et al., "A New High -Performance Poly-Si TFT by Simple Excimer Laser Annealing on Selectively Floating a Si Layer", IEDM Tech. Digest, 2001, pp. 753-756; Hara, A. et al, "Selective Single-Crystalline-Silicon Growth at the Pre-Defined Active Regions of TFTs on a Glass by a Scanning CW Layer Irradiation", IEDM Tech. Digest, 2000, pp. 209-212; and Hara, A. et al., "High Performance Poly-Si TFTs on a Glass by a Stable Scanning CW Laser Lateral Crystallization", IEDM Tech. Digest, 2001, pp. 747-750). Such techniques have allowed relatively defect-free large crystals to be grown, with resulting TFTs shown to exhibit carrier mobility over 300 $cm^2$/V-second.

Another technique which has shown promise for improving carrier mobility is metal-induced lateral recrystallization (MILC), which can be utilized in conjunction with an appropriate high temperature anneal (see, for example, Jagar, S. et al., "Single Grain TFT with SOI CMOS Performance Formed by Metal-Induced-Lateral-Crystallization", IEDM Tech. Digest, 1999, p. 293-296; and Gu, J. et al., "High Performance Sub-100 nm Si TFT by Pattern-Controlled Crystallization of Thin Channel Layer and High Temperature Annealing", DRC Conference Digest, 2002, pp. 49-50). A suitable post-recrystallization anneal for improving the film quality within silicon recrystallized by MILC is accomplished by exposing recrystallized material to a temperature of from about 850° C. to about 900° C. under an inert ambient (with a suitable ambient comprising, for example, $N_2$). MILC can allow nearly single crystal silicon grains to be formed in predefined amorphous-silicon islands for device channel regions. Nickel-induced-lateral-recrystallization can allow device properties to approach those of single crystal silicon.

The carrier mobility of a transistor channel region can be significantly enhanced if the channel region is made of a semiconductor material having a strained crystalline lattice (such as, for example, a silicon/germanium material having a strained lattice, or a silicon material having a strained lattice) formed over a semiconductor material having a relaxed lattice (such as, for example, a silicon/germanium material having a relaxed crystalline lattice). (See, for example, Rim, K. et al., "Strained Si NMOSFETs for High Performance CMOS Technology", VLSI Tech. Digest, 2001, p. 59-60; Cheng, Z. et al., "SiGe-On-Insulator (SGOI) Substrate Preparation and MOSFET Fabrication for Electron Mobility Evaluation" 2001 IEEE SOI Conference Digest, October 2001, pp. 13-14; Huang, L. J. et al., "Carrier Mobility Enhancement in Strained Si-on-Insulator Fabricated by Wafer Bonding", VLSI Tech. Digest, 2001, pp. 57-58; and Mizuno, T. et al., "High Performance CMOS Operation of Strained-SOI MOSFETs Using Thin Film SiGe-on-Insulator Substrate", VLSI Tech. Digest, 2002, p. 106-107.)

The terms "relaxed crystalline lattice" and "strained crystalline lattice" are utilized to refer to crystalline lattices which are within a defined lattice configuration for the semiconductor material, or perturbed from the defined lattice configuration, respectively. In applications in which the relaxed lattice material comprises silicon/germanium having a germanium concentration of from 10% to 60%, mobility enhancements of 110% for electrons and 60-80% for holes can be accomplished by utilizing a strained lattice material in combination with the relaxed lattice material (see for example, Rim, K. et al., "Characteristics and Device Design of Sub-100 nm Strained SiN and PMOSFETs", VLSI Tech. Digest, 2002, 00. 98-99; and Huang, L. J. et al., "Carrier Mobility Enhancement in Strained Si-on-Insulator Fabricated by Wafer Bonding", VLSI Tech. Digest, 2001, pp. 57-58).

Performance enhancements of standard field effect transistor devices are becoming limited with progressive lithographic scaling in conventional applications. Accordingly, strained-lattice-channeled-field effect transistors on relaxed silicon/germanium offers an opportunity to enhance device performance beyond that achieved through conventional lithographic scaling. IBM recently announced the world's fastest communications chip following the approach of utilizing a strained crystalline lattice over a relaxed crystalline lattice (see, for example, "IBM Builds World's Fastest Communications Microchip", Reuters U.S. Company News, Feb. 25, 2002; and Markoff, J., "IBM Circuits are Now Faster and Reduce Use of Power", The New York Times, Feb. 25, 2002).

Although various techniques have been developed for substantially controlling nucleation and grain growth processes of semiconductor materials, grain orientation control is lacking. Further, the post-anneal treatment utilized in conjunction with MILC can be unsuitable in applications in which a low thermal budget is desired. Among the advantages of the invention described below is that such can allow substantial control of crystal grain orientation within a semiconductor material, while lowering thermal budget requirements relative to conventional methods. Additionally, the quality of the grown crystal formed from a semiconductor material can be improved relative to that of conventional methods.

Integrated circuit memory includes dynamic random access memory (DRAM) and static random access memory (SRAM). DRAM cells provide good memory density, but are relatively slow. SRAM cells are faster than DRAM cells, but the area utilized for SRAM cells is large. The large area associated with six-transistor and four-transistor memory cells has limited the design of high-density SRAM devices.

Negative differential resistance (NDR) devices have been used to reduce the number of elements per memory cell. However, NDR devices tend to suffer from problems such as high standby power consumption, high operating voltages, low speeds and complicated fabrication processes. F. Nemati and J. D. Plummer have disclosed a two-device thyristor-based SRAM cell (TRAM) that includes an access transistor and a gate-assisted, vertical thyristor. The disclosed vertical p+/n/p/n+ thyristor is operated in a gate-enhanced switching mode to provide the memory cell with SRAM-like performance and DRAM-like density. The performance of the TRAM cell depends on the turn-off characteristics of the vertical thyristor, and the turn-off characteristics depend on the stored charge and carrier transit time in the p-region of the p+/n/p/n+ thyristor. The turn-off characteristics for the vertical thyristor are improved from milliseconds to five nanoseconds by reverse biasing the thyristor for a write-zero operation and by using a gate to assist with turn-off switching of the thyristor by discharging the stored charge. Even so, the geometry and vertical height of the vertical thyristor's p-region limits the turn-off characteristics and the associated cell performance of the gate-assisted, vertical thyristor disclosed by Nemati and Plummer. The scalability of the TRAM cell and the ability to control the performance of the TRAM cell are also limited.

It would be desirable to provide improved memory cells that provide DRAM-like density, faster SRAM-like performance, and scalability.

SUMMARY OF THE INVENTION

The present invention pertains to SOI constructions comprising at least one memory cell encompassing a transistor and a thyristor. In one aspect, the present invention encompasses a one-device equivalent, gated lateral thyristor-based random access memory (GLTRAM) cell incorporated into a TFT construction. An exemplary memory cell construction includes a crystalline layer comprising silicon and germanium over an electrically insulative material. An access transistor device has an active region extending into the crystalline layer. The entirety of the active region within the crystalline layer is within only a single crystal of the crystalline layer. The transistor device includes a gate, source region and drain region. A thyristor is electrically connected with the source region. The thyristor can be integrated with, and stacked on top of, the access transistor to enhance the density of the memory cell. The geometry of the thyristor can be accurately controlled to provide a lower stored charge volume. Further, the thyristor can be tailored to reduce carrier transit time, which can provide faster performance and improve the gate-assisted turn-off characteristics of the thyristor.

In various aspects, the lateral thyristor can be fabricated using an MILC technique adopted for TFT technology. Accordingly, the GLTRAM cell can be readily scalable with lithography to provide direct scalability with technology generations. In particular embodiments, the stacked lateral thyristor is integrated by raising the source region of the access transistor using a selective epitaxy process. The stacked configuration of the GLTRAM cell can have a footprint less than $8F^2$, and thus can have a higher density than the TRAM cell. Additionally, the GLTRAM cell can have a low standby power consumption during cell operation.

In one aspect, the invention encompasses a memory device which includes a transistor and a thyristor electrically connected with a source/drain region of the transistor. The transistor has a gate supported by a crystalline layer. The crystalline layer is less than or equal to 2000 Angstroms thick, and comprises a Si/Ge material. The transistor has an active region, and at least a portion of the active region is within the Si/Ge material. The active region within the Si/Ge material is contained within a single crystal of the material.

BRIEF DESCRIPTION OF THE DRAWINGS

Preferred embodiments of the invention are described below with reference to the following accompanying drawings.

FIG. 2 is a diagrammatic, cross-sectional view of a fragment of a semiconductor construction shown at a preliminary stage of an exemplary process of the present invention FIG. 3 is a view of the FIG. 2 wafer shown at a processing stage subsequent to that of FIG. 2.

FIG. 4 is a view of the FIG. 2 fragment shown at a processing stage subsequent to that of FIG. 3.

FIG. 5 is a view of the FIG. 2 fragment shown at a processing stage subsequent to that of FIG. 4.

FIG. 6 is a view of the FIG. 2 fragment shown at a processing stage subsequent to that of FIG. 5.

FIG. 7 is a view of the FIG. 2 fragment shown at a processing stage subsequent to that of FIG. 6.

FIGS. 12-16 illustrate an exemplary process for forming the GLTRAM cell of FIG. 11.

FIG. 17 is a diagrammatic, fragmentary top view of adjacent GLTRAM cells in a memory array according to an exemplary aspect of the present invention.

FIG. 18 illustrates read-write operations for GLTRAM cells according to an exemplary aspect of the present invention.

FIG. 21 is a simplified block diagram of a high-level organization illustrating various aspects of an exemplary electronic system of the present invention.

FIG. 22 is a simplified block diagram of a high-level organization illustrating additional aspects of the exemplary electronic system of the present invention.

DETAILED DESCRIPTION OF THE PREFERRED EMBODIMENTS

The present invention pertains to memory devices comprising transistors and thyristors. In particular aspects, the present invention pertains to a one-device equivalent gated lateral thyristor-based SRAM (GLTRAM) cell. The GLTRAM cell includes an access transistor and an integrated, gate-assisted lateral thyristor. The geometry of the lateral thyristor can be accurately controlled to provide a lower stored charged volume. Additional, the geometry of the gate-assisted lateral thyristor is capable of being tailored to reduce carrier transit time, which can provide faster performance and improve gate-assisted turn-off characteristics of the thyristor.

Figure 1:
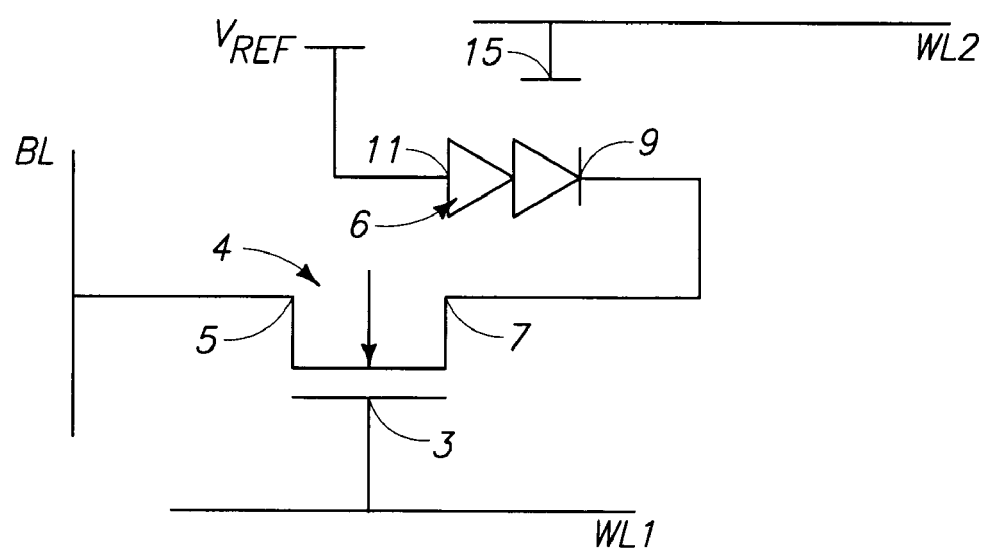
FIG. 1 illustrates a circuit schematic of an exemplary GLTRAM cell according to an aspect of the present invention.

FIG. 1 illustrates a circuit schematic of an exemplary GLTRAM cell 2. Cell 2 includes an access transistor 4 and a thyristor 6. Access transistor 4 can be, for example, an NFET transistor. Thyristor 6 is illustrated as a p+/n/p/n+ thyristor (specifically, it is illustrated as two diodes in the shown schematic diagram). One definition of a thyristor is a semiconductor device for high power switching. Thyristors have also been referred to as semiconductor-controlled rectifiers (SCR). One of ordinary skill in the art can appreciate upon reading and comprehending this disclosure that the present subject matter is not limited to a particular type of semiconductor doping.

A first wordline (WL1) is connected to a gate 3 of access transistor 4. A bitline (BL) is connected to a first source/drain diffusion region 5 (hereinafter referred to as a drain region to simplify the disclosure) of the access transistor 4. A second source/drain region 7 (hereinafter referred to as a source region to simplify the disclosure) of the access transistor 4 is connected to a first end 9 of the thyristor 6. A second end 11 of the thyristor is connected to a voltage ($V_{REF}$). The reference voltage is typically around 0.8 to 1.0 volts, and programming pulses on the bitlines and the wordlines are typically about 2.0 volts. For a p+/n/p/n+ thyristor, the first end 9 comprises the n+ region of the thyristor and is referred to as a cathode; and the second end 11 comprises the p+ region of the thyristor and is referred to as an anode.

A thyristor gate 15 is connected to a second wordline (WL2). The gate 15 assists with switching the thyristor 6, and specifically gates the p/n+ diode part of the thyristor 6 with the fringe field extending into the n region of the thyristor. For the p+/n/p/n+ thyristor, the thyristor gate 15 provides a field to the thyristor around the p region. Such field can significantly increase the turn-off speed of the thyristor and allows a low-voltage turn-on of the thyristor. Additionally, standby leakage power can be reduced.

The second diffusion (source) region 7 functions as a storage node for the memory cell 2. A charge stored at the source region 7 is read by turning on the access transistor 4 (providing a first wordline pulse) and sensing the bitline. A write-one operation is performed by providing a first wordline pulse to turn on the access transistor 4 and provide a current path between the thyristor 6 and the bitline (BL), which is held at a low potential, and providing a second wordline pulse to assist with a low-voltage turn on of the thyristor 6. In this state, the thyristor is "on" and the reference potential is transferred from the anode to the cathode of the thyristor to store "one". A write-zero operation is performed by providing a bitline pulse of sufficient potential to reverse bias the thyristor 6, providing a first wordline pulse to turn on the access transistor, providing a current path between the bitline (BL) and the thyristor 6, and providing a second wordline pulse to increase the turn-off speed of the thyristor 6. The thyristor 6 is reverse biased to a sufficient voltage for a sufficient time period to allow the charge carriers to recombine.

According to various embodiments, thyristor 6 is a lateral p+/n/p/n+ thyristor integrated on top of the access transistor 3. Accordingly, source 7 can be a raised source which functions as a cathode node for the thyristor 6 (such will be described in more detail with reference to FIG. 11 below).

This disclosure pertains not only to GLTRAM cells, but also to SOI constructions incorporating GLTRAM cells. In exemplary aspects, the SOI constructions utilize non-conventional substrates. General aspects of the SOI constructions will next be described with reference FIGS. 2-10, and this disclosure will then return to discussion specific to GLTRAM devices.

Referring to FIG. 2, a fragment of a semiconductor construction 10 is illustrated at a preliminary processing stage. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Construction 10 comprises a base (or substrate) 12 and an insulator layer 14 over the base. Base 12 can comprise, for example, one or more of glass, aluminum oxide, silicon dioxide, metal and plastic. Additionally, and/or alternatively, base 12 can comprise a semiconductor material, such as, for example, a silicon wafer.

Layer 14 comprises an electrically insulative material, and in particular applications can comprise, consist essentially of, or consist of silicon dioxide. In the shown construction, insulator layer 14 is in physical contact with base 12. It is to be understood, however, that there can be intervening materials and layers provided between base 12 and layer 14 in other aspects of the invention (not shown). For example, a chemically passive thermally stable material, such as silicon nitride ($Si_3N_4$), can be incorporated between base 12 and layer 14. Layer 14 can have a thickness of, for example, from about 200 nanometers to about 500 nanometers, and can be referred to as a buffer layer.

Layer 14 preferably has a planarized upper surface. The planarized upper surface can be formed by, for example, chemical-mechanical polishing.

A layer 16 of semiconductive material is provided over insulator layer 14. In the shown embodiment, semiconductive material layer 16 is formed in physical contact with insulator 14. Layer 16 can have a thickness of, for example, from about 5 nanometers to about 10 nanometers. Layer 16 can, for example, comprise, consist essentially of, or consist of either doped or undoped silicon. If layer 16 comprises, consists essentially of, or consists of doped silicon, the dopant concentration can be from about $10^{14}$ atoms/cm$^3$ to about $10^{20}$ atoms/cm$^3$. The dopant can be either n-type or p-type, or a combination of n-type and p-type.

The silicon utilized in layer 16 can be either polycrystalline silicon or amorphous silicon at the processing stage of FIG. 2. It can be advantageous to utilize amorphous silicon in that it is typically easier to deposit a uniform layer of amorphous silicon than to deposit a uniform layer of polycrystalline silicon.

Referring to FIG. 3, material 16 is patterned into a plurality of discrete islands (or blocks) 18. Such can be accomplished utilizing, for example, photoresist (not shown) and photolithographic processing, together with an appropriate etch of material 16.

A capping layer 20 is provided over islands 18 and over portions of layer 14 exposed between the islands. Layer 20 can, for example, comprise, consist essentially of, or consist of one or both of silicon dioxide and silicon. Layer 20 can also comprise multiple layers of silicon dioxide, stress-free silicon oxynitride, and silicon.

After formation of capping layer 20, small voids (nanovoids) and small crystals are formed in the islands 18. The formation of the voids and crystals can be accomplished by ion implanting helium 22 into material 16 and subsequently exposing material 16 to laser-emitted electromagnetic radiation. The helium can aid in formation of the nanovoids; and the nanovoids can in turn aid in crystallization and stress relief within the material 16 during exposure to the electromagnetic radiation. The helium can thus allow crystallization to occur at lower thermal budgets than can be achieved without the helium implantation. The helium is preferably implanted selectively into islands 18 and not into regions between the islands. The exposure of construction 10 to electromagnetic radiation can comprise subjecting the construction to scanned continuous wave laser irradiation while the construction is held at an appropriate elevated temperature (typically from about 300° C. to about 450° C.). The exposure to the electromagnetic radiation can complete formation of single crystal seeds within islands 18. The laser irradiation is scanned along an axis 24 in the exemplary shown embodiment.

The capping layer 20 discussed previously is optional, but can beneficially assist in retaining helium within islands 18 and/or preventing undesirable impurity contamination during the treatment with the laser irradiation.

Referring to FIG. 4, islands 18 are illustrated after voids have been formed therein. Additionally, small crystals (not shown) have also been formed within islands 18 as discussed above.

Capping layer 20 (FIG. 3) is removed, and subsequently a layer 26 of semiconductive material is formed over islands 18. Layer 26 can comprise, consist essentially of, or consist of silicon and germanium; or alternatively can comprise, consist essentially of, or consist of doped silicon/germanium. The germanium concentration within layer 26 can be, for example, from about 10 atomic percent to about 60 atomic percent. In the shown embodiment, layer 26 physically contacts islands 18, and also physically contacts insulator layer 14 in gaps between the islands. Layer 26 can be formed to a thickness of, for example, from about 50 nanometers to about 100 nanometers, and can be formed utilizing a suitable deposition method, such as, for example, plasma-assisted chemical vapor deposition.

A capping layer 28 is formed over semiconductor layer 26. Capping layer 28 can comprise, for example, silicon dioxide. Alternatively, capping layer 28 can comprise, for example, a combination of silicon dioxide and stress-free silicon oxynitride. Capping layer 28 can protect a surface of layer 26 from particles and contaminants that could otherwise fall on layer 26. If the processing of construction 10 occurs in an environment in which particle formation and/or incorporation of contaminants is unlikely (for example, an ultrahigh vacuum environment), layer 28 can be eliminated from the process. Layer 28 is utilized in the patterning of a metal (discussed below). If layer 28 is eliminated from the process, other methods besides those discussed specifically herein can be utilized for patterning the metal.

Referring to FIG. 5, openings 30 are extended through capping layer 28 and to an upper surface of semiconductive material 26. Openings 30 can be formed by, for example, photolithographic processing to pattern a layer of photoresist (not shown) into a mask, followed by a suitable etch of layer 28 and subsequent removal of the photoresist mask.

A layer 32 of metal-containing material is provided within openings 30, and in physical contact with an upper surface of semiconductive material 26. Layer 32 can have a thickness of, for example, less than or equal to about 10 nanometers. The material of layer 32 can comprise, consist essentially of, or consist of, for example, nickel. Layer 32 can be formed by, for example, physical vapor deposition. Layer 32 can be formed to be within openings 30 and not over material 28 (as is illustrated in FIG. 5) by utilizing deposition conditions which selectively form metal-containing layer 32 on a surface of material 26 relative to a surface of material 28. Alternatively, material 32 can be deposited by a substantially non-selective process to form the material 32 over the surface of material 28 as well as over the surface of material 26 within openings 30, and subsequently material 32 can be selectively removed from over surfaces of material 28 while remaining within openings 30. Such selective removal can be accomplished by, for example, chemical-mechanical polishing, and/or by forming a photoresist mask (not shown) over the material 32 within openings 30, while leaving other portions of material 32 exposed, and subsequently removing such other portions to leave only the segments of material 32 within openings 30. The photoresist mask can then be removed.

Oxygen 34 is ion implanted through layers 26 and 28, and into layer 16 to oxidize the material of layer 16. For instance, if layer 16 consists of silicon, the oxygen can convert the silicon to silicon dioxide. Such swells the material of layer 16, and accordingly fills the nanovoids that had been formed earlier. The oxygen preferably only partially oxidizes layer 16, with the oxidation being sufficient to fill all, or at least substantially all, of the nanovoids; but leaving at least some of the seed crystals within layer 16 that had been formed with the laser irradiation discussed previously. In some aspects, the oxidation can convert a lower portion of material 16 to silicon dioxide while leaving an upper portion of material 16 as non-oxidized silicon.

The oxygen ion utilized as implant 34 can comprise, for example, oxygen ($O_2$) or ozone ($O_3$). The oxygen ion implant can occur before or after formation of openings 30 and provision of metal-containing layer 32.

Construction 10 is exposed to continuous wave laser irradiation while being held at an appropriate temperature (which can be, for example, from about 300° C. to about 450° C.; or in particular applications can be greater than or equal to 550° C.) to cause transformation of at least some of layer 26 to a crystalline form. The exposure to the laser irradiation comprises exposing the material of construction 10 to laser-emitted electromagnetic radiation scanned along a shown axis 36. Preferably, the axis 36 along which the laser irradiation is scanned is the same axis that was utilized for scanning of laser irradiation in the processing stage of FIG. 3.

The crystallization of material 26 (which can also be referred to as a recrystallization of the material) is induced utilizing metal-containing layer 32, and accordingly corresponds to an application of MILC. The MILC transforms material 26 to a crystalline form and the seed layer provides the crystallographic orientation while undergoing partial oxidation.

The crystal orientation within crystallized layer 26 can originate from the crystals initially formed in islands 18. Accordingly, crystal orientations formed within layer 26 can be controlled through control of the crystal orientations formed within the semiconductive material 16 of islands 18.

The oxidation of part of material 16 which was described previously can occur simultaneously with the MILC arising from continuous wave laser irradiation. Partial oxidation of seed layer 16 facilitates: (1) Ge enrichment into Si-Ge layer 26 (which improves carrier mobility); (2) stress-relief of Si-Ge layer 26; and (3) enhancement of recrystallization of Si-Ge layer 26. The crystallization of material 26 can be followed by an anneal of material 26 at a temperature of, for example, about 900° C. for a time of about 30 minutes, or by an appropriate rapid thermal anneal, to further ensure relaxed, defect-free crystallization of material 26.

FIG. 6 shows construction 10 after the processing described above with reference to FIG. 5. Specifically, the voids that had been in material 16 are absent due to the oxidation of material 16. Also, semiconductive material 26 has been transformed into a crystalline material (illustrated diagrammatically by the cross-hatching of material 26 in FIG. 6). Crystalline material 26 can consist of a single large crystal, and accordingly can be monocrystalline. Alternatively, crystalline material 26 can be polycrystalline. If crystalline material 26 is polycrystalline, the crystals of the material will preferably be equal in size or larger than the blocks 18. In particular aspects, each crystal of the polycrystalline material can be about as large as one of the shown islands 18. Accordingly, the islands can be associated in a one-to-one correspondence with crystals of the polycrystalline material.

The shown metal layers 32 are effectively in a one-to-one relationship with islands 18, and such one-to-one correspondence of crystals to islands can occur during the MILC. Specifically, single crystals can be generated relative to each of islands 18 during the MILC process described with reference to FIG. 5. It is also noted, however, that although the metal layers 32 are shown in a one-to-one relationship with the islands in the cross-sectional views of FIGS. 5 and 6, the construction 10 comprising the shown fragment should be understood to extend three dimensionally. Accordingly, the islands 18 and metal layers 32 can extend in directions corresponding to locations into and out of the page relative to the shown cross-sectional view. There can be regions of the construction which are not shown where a metal layer overlaps with additional islands besides the shown islands.

Referring to FIG. 7, layers 28 and 32 (FIG. 6) are removed, and subsequently a layer 40 of crystalline semiconductive material is formed over layer 26. In typical applications, layer 26 will have a relaxed crystalline lattice and layer 40 will have a strained crystalline lattice. As discussed previously, layer 26 will typically comprise both silicon and germanium, with the germanium being present to a concentration of from about 10 atomic percent to about 60 atomic percent. Layer 40 can comprise, consist essentially of, or consist of either doped or undoped silicon; or alternatively can comprise, consist essentially of, or consist of either doped or undoped silicon/germanium. If layer 40 comprises silicon/germanium, the germanium content can be from about 10 atomic percent to about 60 atomic percent.

Strained lattice layer 40 can be formed by utilizing methods similar to those described in, for example, Huang, L. J. et al., "Carrier Mobility Enhancement in Strained Si-on-Insulator Fabricated by Wafer Bonding", VLSI Tech. Digest, 2001, pp. 57-58; and Cheng, Z. et al., "SiGe-On-Insulator (SGOI) Substrate Preparation and MOSFET Fabrication for Electron Mobility Evaluation" 2001 IEEE SOI Conference Digest, October 2001, pp. 13-14.

Strained lattice layer 40 can be large polycrystalline or monocrystalline. If strained lattice layer 40 is polycrystalline, the crystals of layer 40 can be large and in a one-to-one relationship with the large crystals of a polycrystalline relaxed crystalline layer 26. Strained lattice layer 40 is preferably monocrystalline over the individual blocks 18.

The strained crystalline lattice of layer 40 can improve mobility of carriers relative to the material 26 having a relaxed crystalline lattice. However, it is to be understood that layer 40 is optional in various aspects of the invention.

Each of islands 18 can be considered to be associated with a separate active region 42, 44 and 46. The active regions can be separated from one another by insulative material subsequently formed through layers 26 and 40 (not shown). For instance, a trenched isolation region can be formed through layers 26 and 40 by initially forming a trench extending through layers 26 and 40 to insulative material 14, and subsequently filling the trench with an appropriate insulative material such as, for example, silicon dioxide.

As discussed previously, crystalline material 26 can be a single crystal extending across an entirety of the construction 10 comprising the shown fragment, and accordingly extending across all of the shown active regions. Alternatively, crystalline material 26 can be polycrystalline. If crystalline material 26 is polycrystalline, the single crystals of the polycrystalline material will preferably be large enough so that only one single crystal extends across a given active region. In other words, active region 42 will preferably comprise a single crystal of material 26, active region 44 will comprise a single crystal of the material, and active region 46 will comprise a single crystal of the material, with the single crystals being separate and discrete relative to one another.

Figure 8:
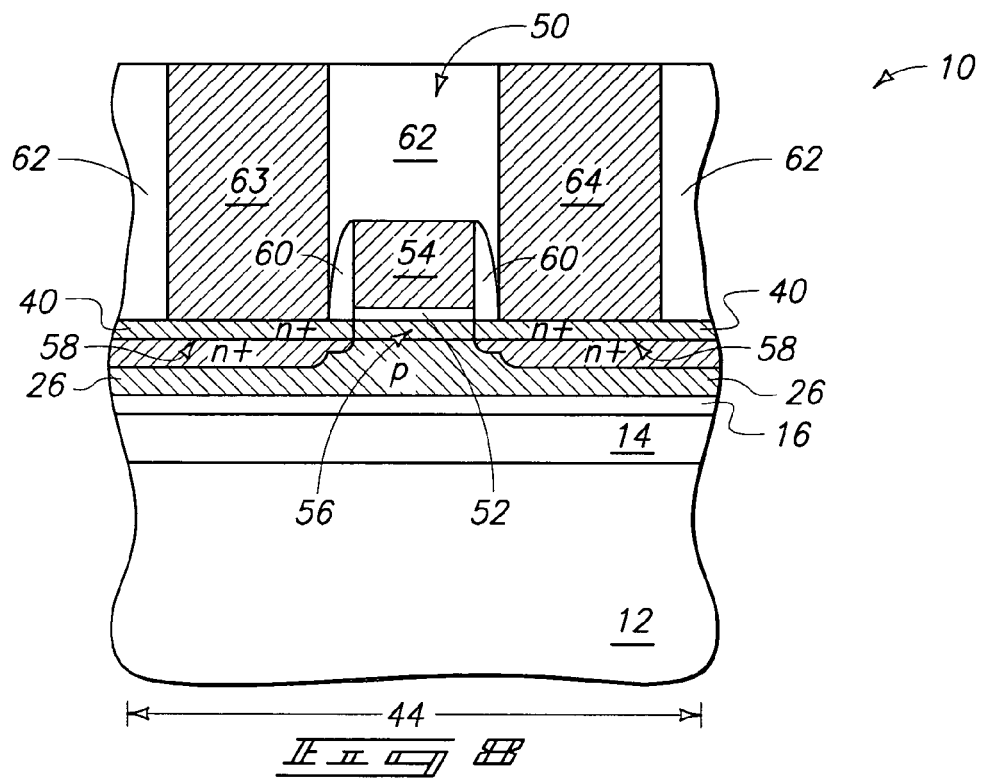
FIG. 8 is an expanded region of the FIG. 7 fragment shown at a processing stage subsequent to that of FIG. 7 in accordance with an exemplary embodiment of the present invention.

FIG. 8 shows an expanded view of active region 44 at a processing stage subsequent to that of FIG. 7, and specifically shows a transistor device 50 associated with active region 44 and supported by crystalline material 26.

Transistor device 50 comprises a dielectric material 52 formed over strained lattice 40, and a gate 54 formed over dielectric material 52. Dielectric material 52 typically comprises silicon dioxide, and gate 54 typically comprises a stack including an appropriate conductive material, such as, for example, conductively-doped silicon and/or metal.

A channel region 56 is beneath gate 54, and in the shown construction extends across strained crystalline lattice material 40. The channel region may also extend into relaxed crystalline lattice material 26 (as shown). Channel region 56 is doped with a p-type dopant.

Transistor construction 50 additionally comprises source/drain regions 58 which are separated from one another by channel region 56, and which are doped with n-type dopant to an n$^+$ concentration (typically, a concentration of at least $10^{21}$ atoms/cm$^3$). In the shown construction, source/drain regions 58 extend across strained lattice layer 40 and into relaxed lattice material 26. Although source/drain regions 58 are shown extending only partially through relaxed lattice layer 26, it is to be understood that the invention encompasses other embodiments (not shown) in which the source/drain regions extend all the way through relaxed material 26 and to material 16.

Channel region 56 and source/drain regions 58 can be formed by implanting the appropriate dopants into crystalline materials 26 and 40. The dopants can be activated by rapid thermal activation (RTA), which can aid in keeping the thermal budget low for fabrication of field effect transistor 50.

An active region of transistor device 50 extends across source/drain regions 58 and channel region 56. Preferably the portion of the active region within crystalline material 26 is associated with only one single crystal of material 26. Such can be accomplished by having material 26 be entirely monocrystalline. Alternatively, material 26 can be polycrystalline and comprise an individual single grain which accommodates the entire portion of the active region that is within material 26. The portion of strained lattice material 40 that is encompassed by the active region is preferably a single crystal, and can, in particular aspects, be considered an extension of the single crystal of the relaxed lattice material 26 of the active region.

Crystalline materials 40 and 26 can, together with any crystalline structures remaining in material 16, have a total thickness of less than or equal to about 2000 Å. Accordingly the crystalline material can correspond to a thin film formed over an insulative material. The insulative material can be considered to be insulative layer 14 alone, or a combination of insulative layer 14 and oxidized portions of material 16.

The transistor structure 50 of FIG. 8 corresponds to an n-type field effect transistor (NFET), and in such construction it can be advantageous to have strained crystalline material 40 consist of a strained silicon material having appropriate dopants therein. The strained silicon material can improve mobility of electrons through channel region 56, which can improve performance of the NFET device relative to a device lacking the strained silicon lattice. Although it can be preferred that strained lattice material 40 comprise silicon in an NFET device, it is to be understood that the strained lattice can also comprise other semiconductive materials. A strained silicon lattice can be formed by various methods. For instance, strained silicon could be developed by various means and lattice 40 could be created by lattice mismatch with other materials or by geometric conformal lattice straining on another substrate (mechanical stress).

As mentioned above, strained lattice 40 can comprise other materials alternatively to, or additionally to, silicon. The strained lattice can, for example, comprise a combination of silicon and germanium. There can be advantages to utilizing the strained crystalline lattice comprising silicon and germanium relative to structures lacking any strained lattice. However, it is generally most preferable if the strained lattice consists of silicon alone (or doped silicon), rather than a combination of silicon and germanium for an NFET device.

A pair of sidewall spacers 60 are shown formed along sidewalls of gate 54, and an insulative mass 62 is shown extending over gate 54 and material 40. Conductive interconnects 63 and 64 extend through the insulative mass 62 to electrically connect with source/drain regions 58. Interconnects 63 and 64 can be utilized for electrically connecting transistor construction 50 with other circuitry external to transistor construction 50. Such other circuitry can include, for example, a bitline and a capacitor in applications in which construction 50 is incorporated into dynamic random access memory (DRAM).

Figure 9:
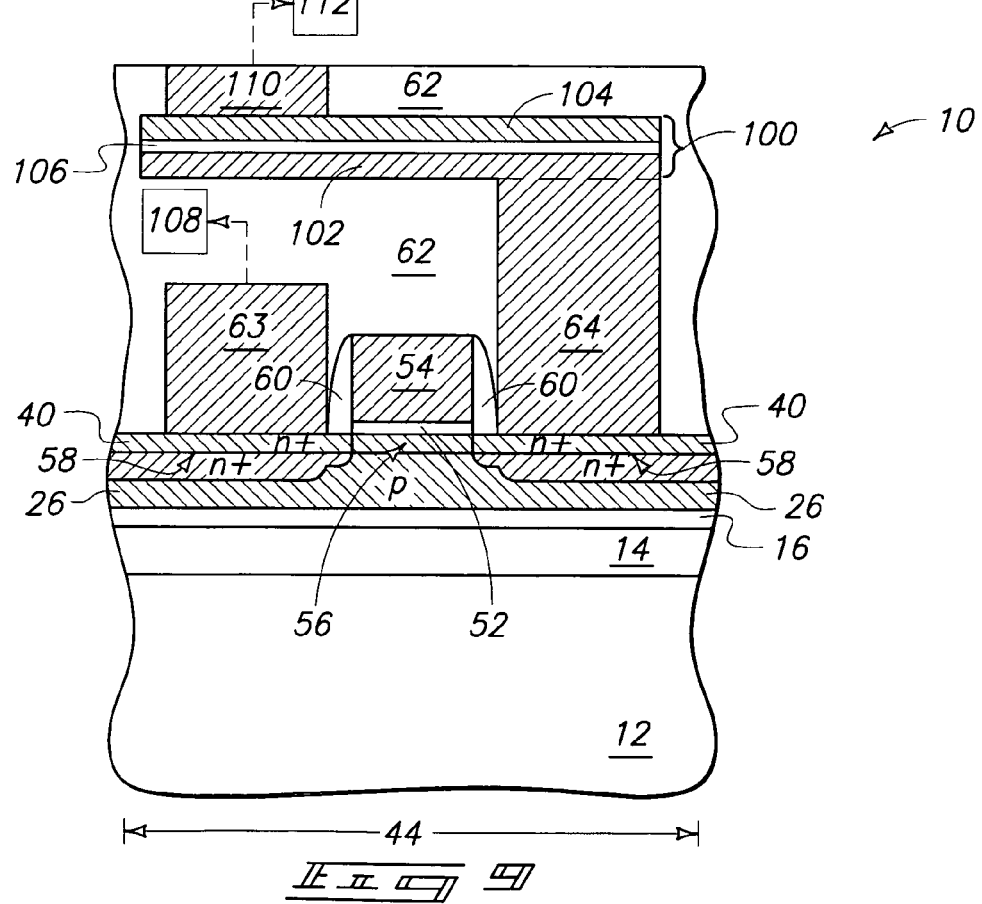
FIG. 9 is a view of the FIG. 8 fragment shown at a processing stage subsequent to that of FIG. 8.

FIG. 9 shows construction 10 at a processing stage subsequent to that of FIG. 8, and shows a capacitor structure 100 formed over and in electrical contact with conductive interconnect 64. The shown capacitor structure extends across gate 54 and interconnect 63.

Capacitor construction 100 comprises a first capacitor electrode 102, a second capacitor electrode 104, and a dielectric material 106 between capacitor electrodes 102 and 104. Capacitor electrodes 102 and 104 can comprise any appropriate conductive material, including, for example, conductively-doped silicon. In particular aspects, electrodes 102 and 104 will each comprise n-type doped silicon, such as, for example, polycrystalline silicon doped to a concentration of at least about $10^{21}$ atoms/cm$^3$ with n-type dopant. In a particular aspect of the invention, electrode 102, conductive interconnect 64 and the source/drain region 58 electrically connected with interconnect 64 comprise, or consist of, n-type doped semiconductive material. Accordingly, n-type doped semiconductive material extends from the source/drain region, through the interconnect, and through the capacitor electrode.

Dielectric material 106 can comprise any suitable material, or combination of materials. Exemplary materials suitable for dielectric 106 are high dielectric constant materials including, for example, silicon nitride, aluminum oxide, $TiO_2$, $Ta_2O_5$, $ZrO_2$, etc.

The conductive interconnect 63 is in electrical connection with a bitline 108. Top capacitor electrode 104 is shown in electrical connection with an interconnect 110, which in turn connects with a reference voltage 112, which can, in particular aspects, be ground. The construction of FIG. 9 can be considered a DRAM cell, and such can be incorporated into an electronic system (such as, for example, a computer system) as a memory device.

Figure 10:
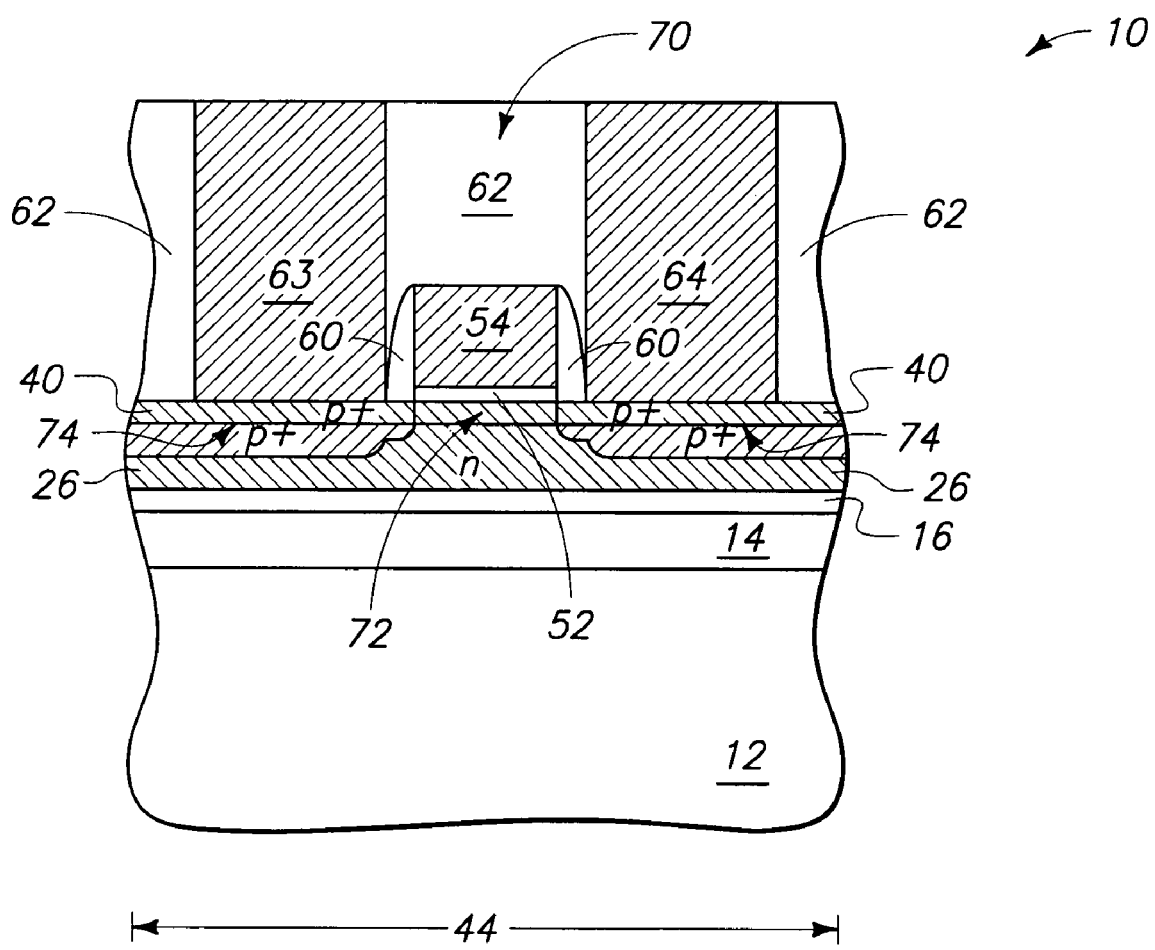
FIG. 10 is a view of an expanded region of FIG. 7 shown at a processing stage subsequent to that of FIG. 7 in accordance with an alternative embodiment relative to that of FIG. 8.

FIG. 10 shows construction 10 at a processing stage subsequent to that of FIG. 7 and alternative to that described previously with reference to FIG. 8. In referring to FIG. 10, similar numbering will be used as is used above in describing FIG. 8, where appropriate.

A transistor construction 70 is shown in FIG. 10, and such construction differs from the construction 50 described above with reference to FIG. 8 in that construction 70 is a p-type field effect transistor (PFET) rather than the NFET of FIG. 8. Transistor device 70 comprises an n-type doped channel region 72 and p$^+$-doped source/drain regions 74. In other words, the channel region and source/drain regions of transistor device 70 are oppositely doped relative to the channel region and source/drain regions described above with reference to the NFET device 50 of FIG. 8.

The strained crystalline lattice material 40 of the PFET device 70 can consist of appropriately doped silicon, or consist of appropriately doped silicon/germanium. It can be most advantageous if the strained crystalline lattice material 40 comprises appropriately doped silicon/germanium in a PFET construction, in that silicon/germanium can be a more effective carrier of holes with higher mobility than is silicon without germanium.

The transistor devices discussed above (NFET device 50 of FIG. 8, and PFET device 70 of FIG. 10) can be utilized in numerous constructions in addition to the construction described above with reference to FIG. 9. For instance, the transistor devices can be utilized in memory cells comprising thyristors, such as, for example, GLTRAM cells.

Figure 11:
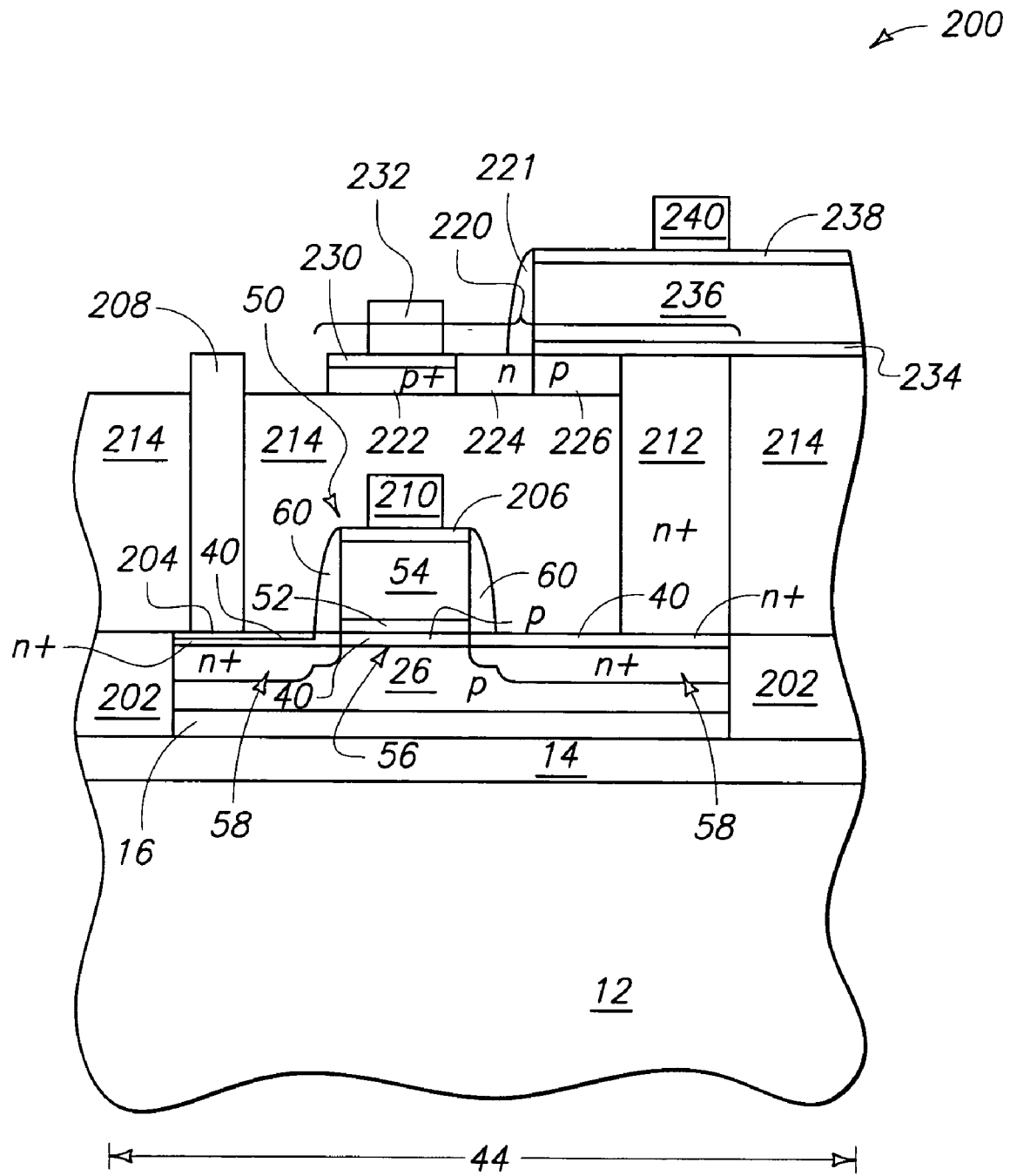
FIG. 11 is a diagrammatic, fragmentary, cross-sectional view of a GLTRAM cell according to an exemplary aspect of the present invention.

FIG. 11 illustrates a cross-sectional view of an exemplary GLTRAM cell 200 formed in accordance with an aspect of the present invention. In referring to cell 200, the numbering utilized above in describing FIGS. 2-10 will be used, where appropriate.

Cell 200 comprises a substrate base 12 having an insulative material 14 formed thereover (described previously with reference to FIGS. 2-10). As discussed previously, substrate base 12 can comprise, for example, one or more of glass, aluminum oxide, silicon dioxide, metal, plastic and/or semiconductor materials (with an exemplary semiconductor material being a p-type doped silicon wafer). Insulative layer 14 can comprise, consist essentially of, or consist of silicon dioxide and can be in physical contact with substrate 12 (as shown), or can be separated by one or more intervening materials and layers.

Layers 16, 26, and 40 are formed over insulative material 14. Layer 16 can, as described above, comprise crystalline silicon and/or silicon dioxide. Layer 26 can comprise, consist essentially of, or consist of Si/Ge; or alternatively can comprise, consist essentially of, or consist of doped Si/Ge. The germanium concentration within layer 26 can be, for example, from 10 atomic percent to about 60 atomic percent. Layer 26 can comprise a relaxed crystalline lattice.

Layer 40 can comprise, consist essentially of, or consist of crystalline semiconductive material (in particular aspects having an appropriate dopant or combination of dopants therein) having a strained crystalline lattice. The crystalline semiconductive material of layer 40 can, for example, comprise, consist essentially of, or consist of either doped or undoped silicon; or alternatively can comprise, consist essentially of, or consist of either doped or undoped Si/Ge. Source/drain regions 58 extend into layers 40 and 26, and in the shown exemplary construction the source/drain regions are n+ doped. Accordingly, the illustrated transistor device is an NFET device. It is noted that source/drain regions 58 of FIG. 11 are similar to the source/drain regions 58 of FIG. 8, and are conductively-doped as were the source/drain regions of FIG. 8. However, the source/drain regions of FIG. 11 are not shown with cross-hatching. None of the conductive materials of FIG. 11 are shown with cross-hatching in an effort to simplify the drawing. The discussion herein will, however, identify the materials of FIG. 11 which are electrically conductive.

A transistor gate 54 is over crystalline material 40, and separated from the crystalline material by a suitable dielectric material 52. Dielectric material 52 can comprise, for example, silicon dioxide.

Sidewall spacers 60 are along sidewalls of gate 54.

A channel region 56 is beneath gate 54 and between the source/drain regions 58. Channel region 56 is doped with a p-type dopant. The NFET device comprising gate 54 is labeled as device 50. Such NFET device has an active region extending into layers 26 and 40. Preferably, the portion of the active region within layer 26 will be entirely contained within a single crystalline grain of the material of layer 26, and also the portion of the active layer within layer 40 will be contained within a single crystalline grain of the material of layer 40.

A pair of isolation regions 202 are shown at edges of layers 16, 26 and 40. Isolation regions 202 can comprise, for example, silicon dioxide, and can correspond to shallow trench isolation regions. Isolation regions 202 electrically isolate an active region of NFET device 50 from adjacent circuitry (not shown).

The illustrated source/drain region 58 on the left of gate 54 can be referred to as a drain region, and the source/drain region 58 on the right of gate 54 can be referred to as a source region. The drain region is silicided (as evidenced by silicide region 204). Also, gate 54 can comprise an upper silicon surface (such as a polysilicon surface) and such surface is silicided in the shown exemplary construction (as evidenced by silicide region 206). Silicide regions 204 and 206 are electrically conductive regions. Silicide region 204 is utilized for forming electrical contact between a bitline 208 and the drain region. Silicide 206 is utilized for forming electrical contact between a wordline 210 and transistor gate 54. Bitline 208 can correspond to the bitline (BL) of FIG. 1 and wordline 210 can correspond to the line labeled WL1 in FIG. 1.

A conductive pedestal 212 extends over source region 58. Pedestal 212 can be considered to be a raised source region of NFET device 50. Pedestal 212 can comprise, consist essentially of, or consist of, for example, n+ doped silicon, such as, for example, n+ doped single crystal silicon or polycrystalline silicon (polysilicon). Raised source region 212 can be formed, for example, utilizing a selective epitaxy process, thereby forming a single crystal silicon pedestal.

An insulative mass 214 extends over layer 40, wordline 210 and gate 54. Mass 214 can comprise, consist essentially of, or consist of, for example, borophosphosilicate glass (BPSG), and/or silicon dioxide. Bitline 208 and raised source region 212 extend through insulative mass 214.

A laterally extending p+/n/p/n+ thyristor 220 includes raised source region 212 as a cathode. Thyristor 220 also includes a p+ region 222, an n region 224, and a p region 226 which are over insulative mass 214. Regions 222, 224 and 226 are elevationally above wordline 210 and transistor gate 54 in the exemplary shown embodiment. P+ region 222 and n region 224 are shown having portions directly above transistor gate 54.

P+ region 222 forms the anode of thyristor 220 and is silicided (as illustrated by silicide region 230). A reference voltage ($V_{REF}$) 232 is electrically connected with p+ region 222 through silicide region 230. Lateral thyristor 220 can be appropriately formed to provide a lower stored charged volume in the p region of the thyristor and to reduce carrier transit time for faster performance and better control of the turn-off characteristics of the thyristor.

A thyristor gate oxide 234 extends over a portion of thyristor 220, and a polysilicon thyristor gate 236 is formed on the thyristor gate oxide 234. The polysilicon thyristor gate 236 is silicided (as illustrated by the silicide region 238). A second wordline 240 is electrically connected to thyristor gate 236 through silicide 238. Wordline 240 can correspond to the wordline labeled as WL2 in FIG. 1. Gate-assisted switching of the thin, lateral thyristor formed in the exemplary shown embodiment can be more effective than gate-assisted switching of vertical thyristors. Although it can be advantageous to utilize laterally-extending thyristors in various aspects of the invention, it is to be understood that other types of thyristors, including vertically-extending thyristors, can be utilized in some aspects of the invention.

A thin film silicon layer is typically utilized to form regions 222, 224 and 226 of thyristor 220. Such thin film silicon is initially doped with n-type impurities at a doping level of $1 \times 10^{17}$ atoms/cm$^3$ or lower, which remains the doping level for the p+/n background level of the thyristor 220. All of the regions of the gates for the first and second wordlines are heavily doped with n-type impurities, although the gate for the thyristor could also be p-type if such is appropriate when taking into a consideration the work function differences association with such option.

Various figures, including FIG. 11, show various different dopant levels. Such figures can utilize one or more of the designations p+, p, p−, n−, n and n+ to distinguish the levels. The difference in dopant concentration between the regions identified as being p+, p and p− are typically as follows. A p+ region has a dopant concentration of at least about $10^{20}$ atoms/cm$^3$, a p region has a dopant concentration of from about $10^{14}$ to about $10^{18}$ atoms/cm$^3$, and a p− region has a dopant concentration in the order of or less than $10^{16}$ atoms/cm$^3$. It is noted that regions identified as being n−, n and n+ will have dopant concentrations similar to those described above relative to the p−, p and p+ regions respectively, except, of course, the n regions will have an opposite-type conductivity enhancing dopant therein than do the p regions.

The p+, p, and p− dopant levels are shown in the drawing only to illustrate differences in dopant concentration. It is noted that the term "p" is utilized herein to refer to both a dopant type and a relative dopant concentration. To aid in interpretation of this specification and the claims that follow, the term "p" is to be understood as referring only to dopant type, and not to a relative dopant concentration, except when it is explicitly stated that the term "p" refers to a relative dopant concentration. Accordingly, for purposes of interpreting this disclosure and the claims that follow, it is to be understood that the term "p-type doped" refers to a dopant type of a region and not a relative dopant level. Thus, a p-type doped region can be doped to any of the p+, p, and p− dopant levels discussed above. Similarly, an n-type doped region can be doped to any of the n+, n, and n− dopant levels discussed above.

FIGS. 12-16 illustrate an exemplary process for forming the GLTRAM cell of FIG. 11. The process steps for fabrication of the GLTRAM device 200 can be compatible with standard processing technology.

Figure 12:
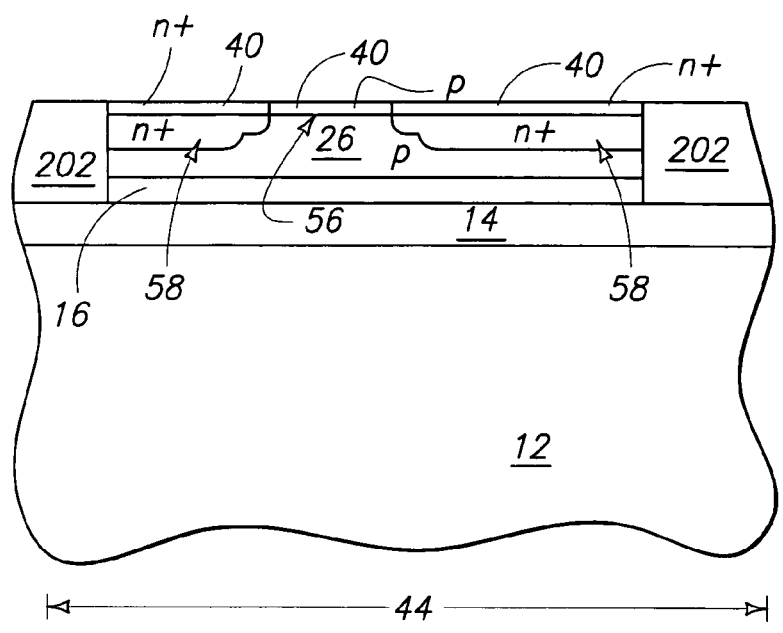

Referring to FIG. 12, n+ diffusion regions 58 for the access transistor are formed in p-type doped layers 26 and 40 using standard fabrication steps, such as, for example, a dopant implant. The access transistor is isolated using shallow trench isolation (STI) processing techniques, as represented by the illustrated formation of isolation regions 202. It is noted that source/drain regions 58 can be formed before formation of an access transistor gate (as shown), or in alternative processing can be formed after formation of the access transistor gate utilizing a self-aligned implant relative to the access transistor gate.

Figure 13:
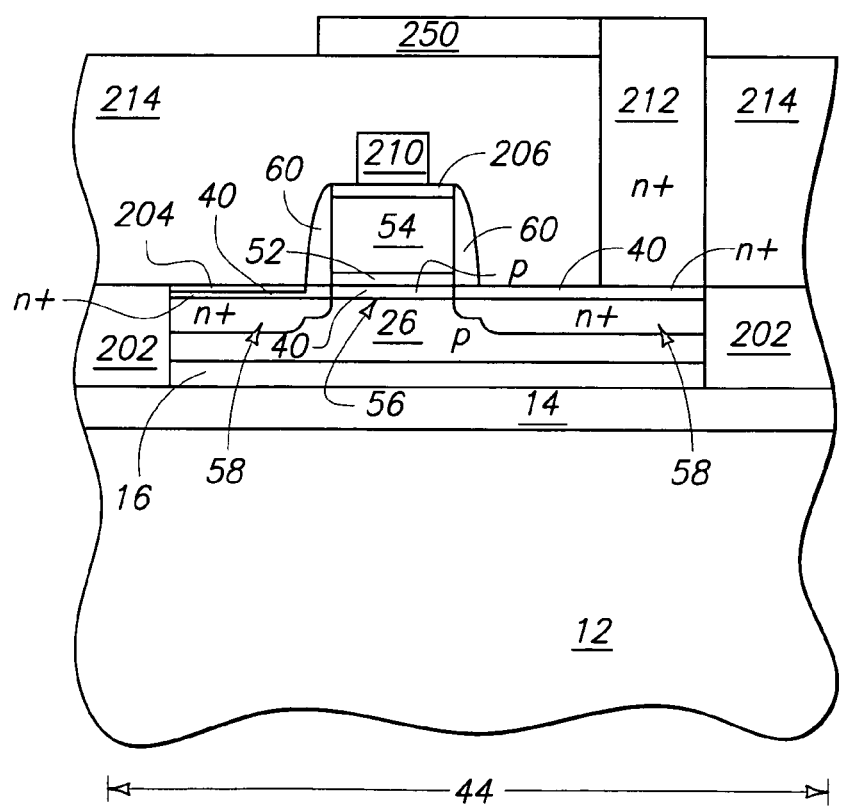

FIG. 13 shows gate oxide 52, transistor gate 54, and sidewall spacers 60 formed over layer 40. Additionally, silicide regions 204 and 206 have been formed, as has first wordline 210, with wordline 210 being an extension of the gate 54/206. A block source mask can be used to prevent silicidation of the n+ source region during the silicidation of the n+ drain region and the transistor gate.

An insulative material layer 214, such as, for example, an oxide layer is formed. An exemplary oxide layer is a low-temperature oxide layer, which can be appropriately deposited.

Raised source region 212 (which can also be referred to as the n+ cathode region of the thyristor 220 (FIG. 11)) is formed to extend through oxide layer 214 and to drain region 58. Such can be accomplished by opening a window through mass 214 and to the crystalline semiconductive material of layer 40 for a selective epitaxy deposition process to raise the n+ source region and thereby form the shown pedestal 212. A thyristor cathode mask can be used to perform the selected epitaxy process and thereby form the raised source region 212 of the access transistor.

A thin layer of n-doped amorphous silicon 250 is deposited over insulative mass 214. The amorphous silicon can, for example, have a thickness of from about 300 Angstroms to about 1000 Angstroms. An amorphous silicon film mask can be used to accurately and controllably deposit the amorphous silicon in the desired position and with a desired geometry for the thyristor.

Referring to FIG. 14, a layer of low temperature oxide 252 is formed over a portion of amorphous silicon 250. The low temperature oxide can also be formed adjacent pedestal 212 to raise an elevational level of mass 214 on the illustrated right side of pedestal 212 (as shown).

A layer 254 of an appropriate metal (typically nickel) is provided adjacent layer 252 and over a portion of amorphous silicon 250. Metal layer 254 is utilized to crystallize the silicon of layer 250 through a metal-induced lateral crystallization (MILC) technique. As discussed previously, MILC uses the lateral migration of metals, such as nickel, to enhance the grain size and provide improved crystallentity of a semiconductive material. The MILC process can also smooth out a polysilicon surface. In various embodiments, layer 254 comprises, consists essentially of, or consists of nickel, and is deposited over a defined anode region of thin silicon film 250. A nickel-containing layer 254 can be formed to a thickness of, for example, about 100 Angstroms. A thyristor anode mask can be utilized to deposit the nickel on the amorphous silicon as part of the MILC process. Subsequently, lateral crystallization is carried out in, for example, a nitrogen ambient.

Referring to FIG. 15, metal-containing layer 254 is removed and the layer 252 is utilized as a mask during implantation of p-dopant into thin film 250 (FIG. 14) to form p+ doped anode region 222 of thyristor 220 (FIG. 11). A suitable p-type dopant is boron. The mask level that defines the removable metal strip (such as nickel, for example) for MILC can be utilized to define the p+ anode region 222 of the thyristor. MILC typically uses a low temperature oxide, which is an oxide deposited by chemical vapor deposition at a temperature below about 500° C. In the illustrated exemplary embodiment, the low temperature oxide 252 functions as an implant mask for the p+ anode implant.

Figure 16:
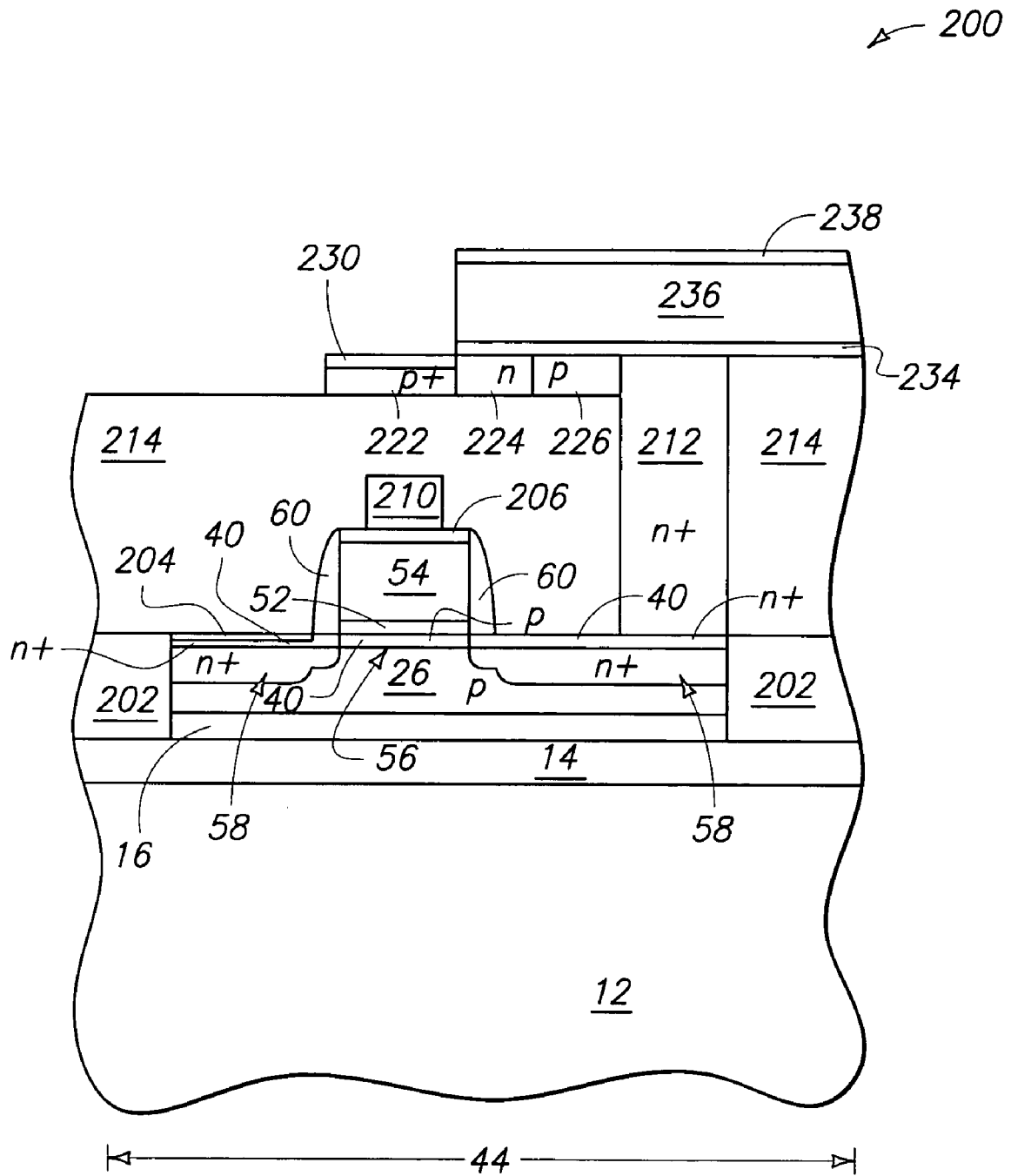

Referring to FIG. 16, oxide layer 252 (FIG. 15) is removed and the gate oxide 234 is grown on top of remaining portions of silicon thin film 250 (FIG. 15). A second wordline polysilicon gate mask can be utilized to define the thyristor gate oxide, the p− region of the thyristor (i.e., the region 226 of the thyristor 220 shown in FIG. 11) and the polysilicon gate 236. Boron is implanted to form the p region of the thyristor. The boron concentration is about $1 \times 10^{17}$ atoms/cm$^3$. The boron penetrates through the gate oxide 234 and counter-dopes the n-type silicon thin film. The n+ region 212 remains unaffected by boron penetration because of the significantly higher doping concentration of the n+ region of the cathode (with a typical concentration being from about $1 \times 10^{20}$ to about $2 \times 10^{20}$ atoms/cm$^3$). The polysilicon gate 236 of the thyristor is formed on the gate oxide 234.

After the gate processing step, both the p+ region 222 and the poly n+ gate for the second wordline (gate 236) are silicided, as shown by the formed silicide regions 230 and 238. The silicidation can be accomplished utilizing standard processing steps. It is noted that the term silicided or silicide is utilized throughout this specification to refer to a metal silicide, such as, for example, nickel-silicide (NiSi$_2$ or Ni$_2$Si), cobalt-silicide (CoSi$_2$), titanium-silicide (TiSi$_2$), tungsten-silicide (WSi$_2$), and the like. The silicides can reduce parasitic series resistance. After formation of the silicide, contact and metallization steps can be conducted, together with other conventional processing to form the completed structure 200 of FIG. 11.

FIG. 17 shows a top view of adjacent GLTRAM cells in a memory array according to various embodiments of the present invention. The illustrated memory array 360 includes a first memory cell 362, a second memory cell 364, and a third memory cell 366. The first and second memory cells 362 and 364 share a bitline contact 368. In other words, the drain regions of the first and second memory cells are in contact with the shared bitline contact. Additionally, the second and third memory cells 364 and 366 share a thyristor gate, as illustrated by the second polysilicon gate (PG2) mask line. The thyristor gate assists with switching the lateral thyristors in both the second memory cell 364 and the third memory cell 366. FIG. 17 also illustrates that the second memory cell 364 and the third memory cell 366 share a thyristor cathode mask (TCM) used to form the raised n+ source region of the access transistors in both the second memory cell and the third memory cell. Cell density can be improved by sharing bitline contacts and thyristor gates. However it is to be understood that the invention also encompasses embodiments (not shown) in which bitline contacts and/or thyristor gates are not shared.

The cathode regions of the cell thyristors are shown in FIG. 17 as n+ regions 332 and 336, and are defined by an appropriate mask prior to the selective-epitaxy process for raising the source regions of the associated access transistors. The mask level defining the raised n+ regions is labeled as a thyristor cathode mask (TCM). The second polysilicon wordline gate overlaps the n+ regions to define the p regions of the associated thyristors. The p regions are formed by counter-doping the background n− region of the thin film silicon layer of the thyristor using the boron implanted polysilicon gate as the doping source. An appropriate dose of boron is implanted into the gate, and a rapid thermal anneal (RTA) is performed to diffuse the boron through the gate oxide and counter-dope the region below. In this manner, a self-aligned highly controlled p− region of the thyristor can be defined. This controlled formation can lower the stored charge volume, improve the turn-off characteristics of the thyristor, and allow the memory cell to have a fast performance. The polysilicon gate for the thyristor can be subsequently doped with a heavy dose of n+ impurity (for example, phosphorous) to form the n+ gate.

FIG. 18 illustrates read-write operations for GLTRAM cells in exemplary aspects of the present invention. The illustrated read-write operations are for a GLTRAM cell comprising an NFET access transistor and a p+/n/p/n+ thyristor, such as is illustrated in FIGS. 1 and 11. As one of ordinary skill in the art will understand, upon reading and comprehending this disclosure, an exemplary cell of the present invention can be designed to operate using different voltages. By way of example, and without limitation, one of ordinary skill in the art will understand, upon reading and comprehending this disclosure, how to incorporate a PFET access transistor instead of an NFET access transistor. Since electrons are typically significantly more mobile than holes, a memory cell incorporating an NFET access transistor is typically faster than a memory cell incorporating a PFET access transistor.

In various embodiments, the power supply voltage (Vdd) is approximately 2.0 volts, the pulse potential of the first wordline (WL1) is approximately 2.0 volts, the pulse potential of the bitline (BL) is approximately 2.0 volts, the pulse potential of the reference node ($V_{REF}$) is approximately 0.8 volts, and the pulse potential of the second wordline (WL2) is approximately 1.5 volts.

WL2 is pulsed for both write-one and write-zero operations while the bitline is pulsed only for write-zero. During the write-one, the second wordline (WL2) assists the thyristor in forward biased "on" mode in which the thyristor is conducting and raising the potential of the floating bitline. During the write-zero, the bitline (BL) pulse reverse biases the cathode node of the thyristor while the second wordline (WL2) pulse assists in switching the thyristor off completely within the short duration of the reverse biased pulse of the bitline (BL). The cell is read by turning on the access transistor using the first wordline (WL1) and sensing the stored charge on the bitline (BL).

The cell performance can be dependent on the thyristor turn-off speed (write-0) which can be dramatically enhanced by using a thyristor gate, and in particular, a lateral thyristor gate. Since the stored charge volume is significantly lower in the lateral thyristor, the gate-assisted lateral thyristor is expected to be turned off within one nanosecond of the bitline pulse, thereby significantly improving the performance of the cell.

Forward and reverse I-V characteristics of the GLTRAM cells indicate that the second wordline voltage can allow a small forward bias potential to turn on the thyristor. Additionally, the GLTRAM can have a very small standby current in the OFF state.

Figure 19:
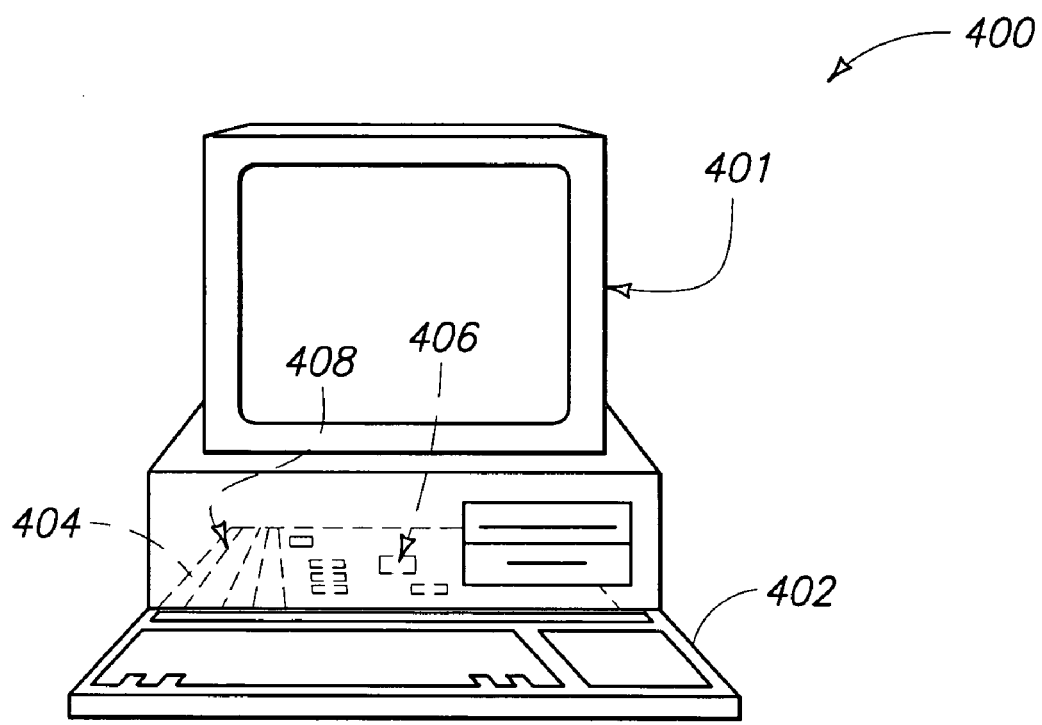
FIG. 19 is a diagrammatic view of a computer illustrating an exemplary application of the present invention.
Figure 20:
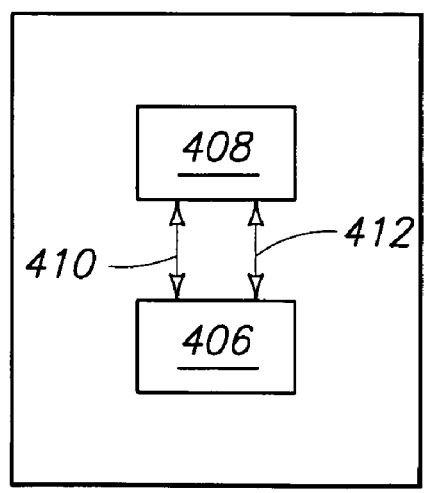
FIG. 20 is a block diagram showing particular features of the motherboard of the FIG. 19 computer.

FIG. 19 illustrates generally, by way of example, but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above, including, for example, the DRAM unit cell described with reference to FIG. 8 or the GLTRAM cell described with reference to FIG. 11. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 20. In such block diagram, the addressing circuitry is illustrated as 410 and the read circuitry is illustrated as 412.

In particular aspects of the invention, memory device 408 can correspond to a memory module. For example, single in-line memory modules (SIMMs) and dual in-line memory modules (DIMMs) may be used in the implementation which utilize the teachings of the present invention. The memory device can be incorporated into any of a variety of designs which provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory which allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or Flash memories.

FIG. 21 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by the processor 702 and other interactions between the processor 702, the memory device unit 706 and the I/O devices 708. The control unit 704 coordinates all operations of the processor 702, the memory device 706 and the I/O devices 708 by continuously cycling through a set of operations that cause instructions to be fetched from the memory device 706 and executed. In various embodiments, the memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include a GLRTAM cell in accordance with various aspects of the present invention.

FIG. 22 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first wordline with pulses, circuitry 886 for providing the second wordline with pulses, and circuitry 888 for providing the bitline with pulses. The system 800 also includes a processor 822, or memory controller for memory accessing.

The memory device 802 receives control signals 824 from the processor 822 over wiring or metallization lines. The memory device 802 is used to store data which is accessed via I/O lines. It will be appreciated by those skilled in the art that additional circuitry and control signals can be provided, and that the memory device 802 has been simplified to help focus on the invention. At least one of the processor 822 or memory device 802 can include a GLTRAM cell of the type described previously in this disclosure.

The various illustrated systems of this disclosure are intended to provide a general understanding of various applications for the circuitry and structures of the present invention, and are not intended to serve as a complete description of all the elements and features of an electronic system using memory cells (such as, for example, GLTRAM cells) in accordance with aspects of the present invention. One of the ordinary skill in the art will understand that the various electronic systems can be fabricated in single-package processing units, or even on a single semiconductor chip, in order to reduce the communication time between the processor and the memory device(s).

Applications for SOI constructions with memory cells utilizing transistors and thyristors (such as, for example, GLTRAM cells) can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A memory device comprising:
   a transistor having a gate supported by a crystalline layer and having a pair of source/drain regions proximate the gate; the crystalline layer comprising a material which includes silicon and germanium; the transistor having an active region; at least a portion of the active region being within the material; the active region within the material being contained within a single crystal of the material, the transistor being an NFET device, and the source/drain regions comprising n+ implant regions extending into the crystalline layer;
   a thyristor electrically connected with one of the source/drain regions; the thyristor having a cathode which electrically contacts and is directly over the n+ implant region of said one of the source/drain regions; the thyristor being a p+/n/p/n+ thyristor; the cathode being a vertically-extending n+ pillar; the p+/n/p portion of the thyristor having no region directly over the n$^+$ pillar, but instead being entirely horizontally extending from a side of the pillar; and
   a thyristor gate over the p portion of the p+/n/p/n+ thyristor.

2. The memory device of claim 1 wherein the crystalline layer is polycrystalline.

3. The memory device of claim 1 wherein the crystalline layer is monocrystalline.

4. The memory device of claim 1 wherein the crystalline layer has a relaxed crystalline lattice, and further comprising a strained crystalline lattice layer between the crystalline layer and the transistor gate.

5. The memory device of claim 4 wherein the strained crystalline lattice includes silicon.

6. The memory device of claim 4 wherein the strained crystalline lattice includes silicon and germanium.

7. An electronic system, the electronic system comprising memory, the memory including:
   an array of memory cells, at least some of the memory cells including transistors, thyristors and thyristor gates; the transistors having gates supported by a crystalline layer; the crystalline layer comprising a material which includes silicon and germanium; the transistors having active regions within the crystalline layer; each active region within the crystalline layer including only one crystal of said material; the transistors being NFET devices comprising n+ source/drain regions extending into the crystalline layer; the thyristors having cathodes which physically contact n+ source/drain regions of the transistors; the thyristors being p+/n/p/n+ thyristors; cathodes of the thyristors being vertically-extending n+ pillars; the p+/n/p portions of the thyristors having no regions directly over the n$^+$ pillars, but instead being entirely horizontally extending from the n$^+$ pillars; the thyristor gates being over the p portions of the p+/n/p/n+ thyristors;
   addressing circuitry coupled to the array of memory cells for accessing individual memory cells in the array of memory cells; and
   a read circuit coupled to the memory cell array for reading data from memory cells in the array of memory cells.

8. The electronic system of claim 7 wherein the crystalline layer is polycrystalline.

9. The electronic system of claim 7 wherein the crystalline layer is monocrystalline.

10. The electronic system of claim 7 wherein the crystalline layer has a relaxed crystalline lattice, and further comprising a strained crystalline lattice layer between the crystalline layer and the transistor gates.

11. The electronic system of claim 10 wherein the strained crystalline lattice includes silicon.

12. The electronic system of claim 10 wherein the strained crystalline lattice includes silicon and germanium.

13. The memory device of claim 1 further comprising a substrate having an electrically insulative material thereover; and wherein the crystalline layer is over the electrically insulative material; the crystalline layer and the electrically insulative material together being comprised by an SOI construction.

14. The memory device of claim 13 wherein the substrate comprises one or both of semiconductive material and silicon dioxide.

15. The memory device of claim 13 wherein the substrate comprises one or more of glass, aluminum oxide, metal and plastic.

16. The electronic system of claim 10 further comprising a substrate having an electrically insulative material thereover; and wherein the crystalline layer is over the electrically insulative material; the crystalline layer and the electrically insulative material together being comprised by an SOI construction.

17. The electronic system of claim 16 wherein the substrate comprises one or both of semiconductive material and silicon dioxide.

18. The electronic system of claim 16 wherein the substrate comprises one or more of glass, aluminum oxide, metal and plastic.

* * * * *